(12) United States Patent
Jarupoonphol et al.

(10) Patent No.: US 8,054,104 B2
(45) Date of Patent: Nov. 8, 2011

(54) DELAY CIRCUIT, SEMICONDUCTOR CONTROL CIRCUIT, DISPLAY DEVICE AND ELECTRONIC DEVICE

(75) Inventors: Werapong Jarupoonphol, Kanagawa (JP); Yoshitoshi Kida, Camberley (GB)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,219

(22) Filed: Mar. 11, 2011

(65) Prior Publication Data

US 2011/0164007 A1 Jul. 7, 2011

Related U.S. Application Data

(62) Division of application No. 12/222,860, filed on Aug. 18, 2008, now Pat. No. 7,956,663.

(30) Foreign Application Priority Data

Aug. 30, 2007 (JP) .................................. 2007-224925

(51) Int. Cl.
*H03K 5/00* (2006.01)
(52) U.S. Cl. ......................................... 327/94; 327/291

(58) Field of Classification Search ........................ None
See application file for complete search history.

(56) References Cited

U.S. PATENT DOCUMENTS 4,698,526 A 10/1987 Allan
7,567,097 B2 7/2009 Wilson et al.

FOREIGN PATENT DOCUMENTS

JP 2005-143068 6/2005

*Primary Examiner* — An Luu
(74) *Attorney, Agent, or Firm* — Rader, Fishman & Grauer PLLC

(57) ABSTRACT

Disclosed herein is a delay circuit for performing one of a charge and a discharge in two stages, and delaying a signal, the delay circuit including an output section configured to output a delayed signal; two power supplies; and a delay inverter; wherein the delay inverter has a first transistor and a second transistor of an identical channel type for one of a first charge and a first discharge, the first transistor and the second transistor being connected in series with each other between the output section and one power supply, and the delay inverter has a third transistor of a different channel type from the first transistor and the second transistor for one of a second charge and a second discharge, the third transistor being connected in parallel with one of the first transistor and the second transistor.

6 Claims, 27 Drawing Sheets

F I G . 3
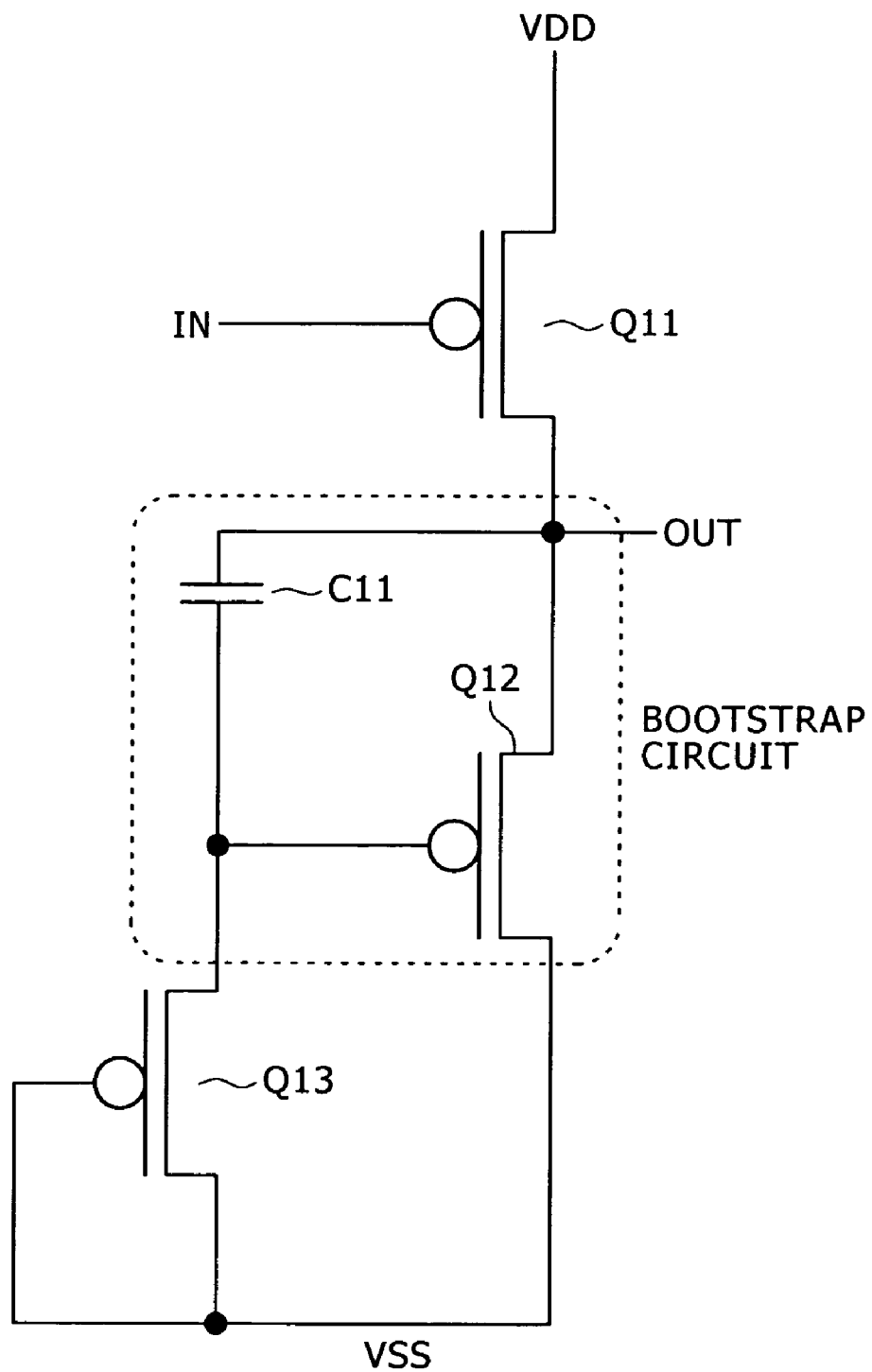

| IN1 | IN2 | OUT |
|---|---|---|
| H | L | LATCHED PREVIOUS STATE |
| L | H | LATCHED PREVIOUS STATE |
| L | L | L |
| H | H | H |

DELAY CIRCUIT, SEMICONDUCTOR CONTROL CIRCUIT, DISPLAY DEVICE AND ELECTRONIC DEVICE

CROSS REFERENCES TO RELATED APPLICATIONS

This is a Divisional Application of patent application Ser. No. 12/222,860, filed Aug. 18, 2008, now U.S. Pat. No. 7,956, 663, which claims priority from Japanese Patent Application JP 2007-224925 filed in the Japan Patent Office on Aug. 30, 2007, the entire contents of which being incorporated herein by reference.

BACKGROUND OF THE INVENTION

1. Field of the Invention

The present invention relates to a delay circuit, a semiconductor control circuit, a display device, and an electronic device.

2. Description of the Related Art

Generally, when an inverter circuit is formed on an insulating substrate of a display device integral with a driving circuit, in a polysilicon process or an amorphous silicon process for TFTs (Thin Film Transistors), variations in transistor characteristics such as threshold voltage Vth, mobility μ and the like are larger than in a single-crystal process.

FIG. 1 is a diagram showing a buffer circuit (hereinafter referred to as a delay buffer circuit) formed by connecting typical CMOS (complementary metal-oxide semiconductor) inverter circuits in two stages to each other.

This circuit has advantages of a simple configuration (small area), a small leakage current (low power consumption) and the like.

It is known, however, that an amount of delay of an output OUT with respect to an input IN is varied depending on variations in characteristics (threshold voltage and mobility) of an N-channel transistor (hereinafter referred to as Nch Tr) or a P-channel transistor (hereinafter referred to as Pch Tr).

That is, the amount of delay is one of quantities that represent the characteristics of the transistor. The amount of delay is large when the characteristics of the transistor are poor. The amount of delay is small when the characteristics of the transistor are good.

A digital circuit can compare the amount of delay easily. Thus, when the amount of delay can be detected accurately, the characteristics of the transistor should be detected easily.

However, the amount of delay by the typical inverter formed by CMOS transistors greatly depends on both Nch Tr and Pch Tr, and is thus unpractical.

For example, FIG. 2 is a diagram showing a relation between an amount of delay of a delay buffer circuit fabricated by a polysilicon process and the characteristics of Nch Tr and Pch Tr.

Inverter circuits formed by merely single-channel transistors are taken up in a few non-patent and patent documents.

For example, there is a bootstrap type inverter circuit introduced in Hisashi Hara, "Fundamentals of MOS Integrated Circuit", Kindai Kagaku Sha Co., Ltd., pp. 94-96 (hereinafter referred to as Non-Patent Document 1). FIG. 3 is a diagram showing the circuit described in Non-Patent Document 1.

The circuit of FIG. 3 includes three single-channel transistors (Pch Tr) Q11, Q12, and Q13 and a capacitor C11.

FIG. 4 is a diagram showing a bootstrap type inverter circuit using single-channel transistors (Pch Tr) introduced in Japanese Patent Laid-Open No. 2005-143068 (hereinafter referred to as Patent Document 1).

A transistor Qp21 has a source connected to a VDD power supply, and has a gate supplied with an input signal IN via a circuit input terminal 21. An output signal OUT is derived from the drain of the transistor Qp21 via a circuit output terminal 22.

A transistor Qp22 has a source connected to the drain of the transistor Qp21, and has a drain connected to a VSS power supply. A capacitance Cp21 is connected between the gate and the source of the transistor Qp22. The capacitance Cp21 forms a bootstrap circuit 23 together with the transistor Qp22.

A transistor Qp23 has a source connected to the gate of the transistor Qp22, and has a drain connected to the VSS power supply. The gate of the transistor Qp23 is supplied with a reference signal REF1. A point of connection between the source of the transistor Qp23 and the gate of the transistor Qp22 will be referred to as a node ND. A transistor Qp24 has a source connected to the VDD power supply, and has a drain connected to the node ND. The gate of the transistor Qp24 is supplied with a reference signal REF2.

FIG. 5 is a diagram showing the respective levels of and timing relation between the input signal IN, the reference signals REF1 and REF2, the potential of the node N, and the output signal OUT in the circuit of FIG. 4.

A period during which the reference signal REF1 is at a VSS level is referred to as a precharge period. A period during which the reference signal REF2 is at the VSS level is referred to as a reset period.

By providing these reset and precharge periods, it is possible to suppress a leakage current, make the amplitude of potential of the output signal OUT equal to the amplitude of potential of the input signal IN, and increase the number of stages.

SUMMARY OF THE INVENTION

However, the circuit described in Non-Patent Document 1 consumes high power, and is thus unsuitable for low power consumption, which is one of themes of next-generation mobile devices.

The bootstrap type inverter circuit introduced in Patent Document 1 is improved in leakage consumed power, but has a large circuit scale (transistors and 2 capacitances per delay buffer). Further, a plurality of input signals are necessary. The bootstrap type inverter circuit is not suitable for a narrow frame.

That is, there is a large number of circuit constituent elements, the circuit input signals REF1 and REF2 as well as the circuit input signal IN are necessary (that is, a layout area for wiring and an area for a signal generating circuit and the like are necessary), and there is still a precharge period, during which period a leakage current flows. Thus, the bootstrap type inverter circuit is not suitable for a narrower frame and lower power consumption.

As described above, generally, in a polysilicon process or an amorphous silicon process for TFTs (Thin Film Transistors) formed on an insulating substrate of a display device integral with a driving circuit, variations in transistor characteristics such as threshold voltage Vth, mobility μ and the like are larger than in a single-crystal process.

Thus, in making a design, transistor size is increased or the level of driving power supply voltage is raised to secure a sufficient operating margin for the large variations.

As a result, for example an increase in power consumption and a large frame due to the large transistor size become a problem. Many techniques have been proposed, including a driving system for reducing power consumption and a narrow frame layout method.

FIG. 6 is a diagram showing an example of configuration of a driving system for reducing power consumption (see Japanese Patent Laid-Open No. 2007-60722, for example).

A speed monitoring circuit 33 formed by a delay circuit 31 and a phase-frequency comparing circuit 32 receives a control signal for changing speed, and outputs a speed detection signal according to the operating speed of the speed monitoring circuit 33.

A substrate bias controlling circuit 34 detects the operating speed of the speed monitoring circuit on the basis of the speed detection signal S33 output by the speed monitoring circuit 33, compares the operating speed of the speed monitoring circuit with a control signal, and generates a PMOS (P-channel metal oxide semiconductor) substrate bias and an NMOS (N-channel metal oxide semiconductor) substrate bias such that the operating speed becomes a desired value. The substrate bias controlling circuit 34 then supplies the PMOS substrate bias and the NMOS substrate bias to the speed monitoring circuit 33 and a semiconductor region of a main circuit 35 in which region P Tr and N Tr are each formed. Thus, a semiconductor control circuit by which transistor variations are accommodated and an improvement in yield and higher speed are achieved is obtained.

However, this technique needs to use the substrate bias voltages in order to maintain a desired operating speed.

The technique may not be generally applied to transistors formed on an insulating substrate without a substrate bias.

In addition, because a hysteresis characteristic is not provided, substrate bias values are selected alternately, and a desired speed value may not be retained at a center. There is thus an unstable state. In addition, there is no advantage of lower power consumption.

It is desirable to provide a delay circuit, a semiconductor control circuit, a display device, and an electronic device that can achieve a narrower frame and lower power consumption.

According to a first embodiment of the present invention, there is provided a delay circuit for performing one of a charge and a discharge in two stages, and delaying a signal, the delay circuit including: an output section configured to output a delayed signal; two power supplies; and a delay inverter; wherein the delay inverter has a first transistor and a second transistor of an identical channel type for one of a first charge and a first discharge, the first transistor and the second transistor being connected in series with each other between the output section and one power supply, and the delay inverter has a third transistor of a different channel type from the first transistor and the second transistor for one of a second charge and a second discharge, the third transistor being connected in parallel with one of the first transistor and the second transistor.

Preferably, a pulse of opposite phase in front of an input of the delay inverter is supplied to gates of the first transistor and the second transistor, and one of the first charge and the first discharge is performed with the pulse of opposite phase in front of the input of the delay inverter, and an input pulse of the delay inverter is supplied to a gate of the third transistor, and one of the second charge and the second discharge is performed with the input pulse of the delay inverter.

According to a second embodiment of the present invention, there is provided a delay circuit for performing one of a charge and a discharge in two stages, and delaying a signal, the delay circuit including: an output section configured to output a delayed signal; two power supplies; and a delay inverter; wherein the delay inverter has a first transistor and a second transistor of an identical channel type for one of a first charge and a first discharge, the first transistor and the second transistor being connected in series with each other between the output section and one power supply, and the delay inverter has a third transistor of a different channel type from the first transistor and the second transistor for one of a second charge and a second discharge, the third transistor being connected in parallel with one of the first transistor and the second transistor, and the delay inverter has a fourth transistor and a fifth transistor of the same channel type as the third transistor for one of the first charge and the first discharge, the fourth transistor and the fifth transistor being connected in series with each other between the output section and the other power supply, and the delay inverter has a sixth transistor of the same channel type as the first transistor and the second transistor for one of the second charge and the second discharge, the sixth transistor being connected in parallel with one of the fourth transistor and the fifth transistor.

According to a third embodiment of the present invention, there is provided a semiconductor control circuit for supplying a control signal to a circuit to be controlled, the semiconductor control circuit including: a delay circuit for receiving a detection pulse, and outputting a plurality of delayed signals having different amounts of delay according to transistor characteristics; a sampling circuit for sampling the delayed signals of the delay circuit with the detection pulse as a reference signal; and a hysteresis characteristic generating circuit for generating the control signal having a hysteresis characteristic according to a difference between the plurality of delayed signals sampled by the sampling circuit.

Preferably, the delay circuit includes a plurality of delay series of different channel types.

According to a fourth embodiment of the present invention, there is provided a display device including: an effective display section; at least one peripheral circuit for performing processing related to operation of the effective display section; and a semiconductor control circuit for outputting a control signal with the peripheral circuit as a circuit to be controlled; the effective display section, the peripheral circuit, and the semiconductor control circuit being formed integrally with each other on an insulating substrate; wherein the semiconductor control circuit includes a delay circuit for receiving a detection pulse, and outputting a plurality of delayed signals having different amounts of delay according to transistor characteristics, a sampling circuit for sampling the delayed signals of the delay circuit with the detection pulse as a reference signal, and a hysteresis characteristic generating circuit for generating the control signal having a hysteresis characteristic according to a difference between the plurality of delayed signals sampled by the sampling circuit.

According to a fifth embodiment of the present invention, there is provided an electronic device having a display device, wherein the display device includes an effective display section, at least one peripheral circuit for performing processing related to operation of the effective display section, and a semiconductor control circuit for outputting a control signal with the peripheral circuit as a circuit to be controlled, the effective display section, the peripheral circuit, and the semiconductor control circuit being formed integrally with each other on an insulating substrate, and the semiconductor control circuit includes a delay circuit for receiving a detection pulse, and outputting a plurality of delayed signals having different amounts of delay according to transistor characteristics, a sampling circuit for sampling the delayed signals of the delay circuit with the detection pulse as a reference signal, and a hysteresis characteristic generating circuit for generating the control signal having a hysteresis characteristic according to a difference between the plurality of delayed signals sampled by the sampling circuit.

According to the embodiments of the present invention, a semiconductor control circuit is formed on an insulating substrate of a display device integral with a driving circuit. It is possible to achieve low power consumption, simple configuration, small layout area, and delay processing that is performed depending on merely one transistor type (Pch Tr or Nch Tr).

According to the embodiments of the present invention, it is possible to achieve a narrower frame and low power consumption.

BRIEF DESCRIPTION OF THE DRAWINGS

FIG. 3 is a diagram showing a circuit described in Non-Patent Document 1;

DETAILED DESCRIPTION OF THE PREFERRED EMBODIMENTS

Preferred embodiments of the present invention will hereinafter be described with reference to the drawings.

Figure 7:
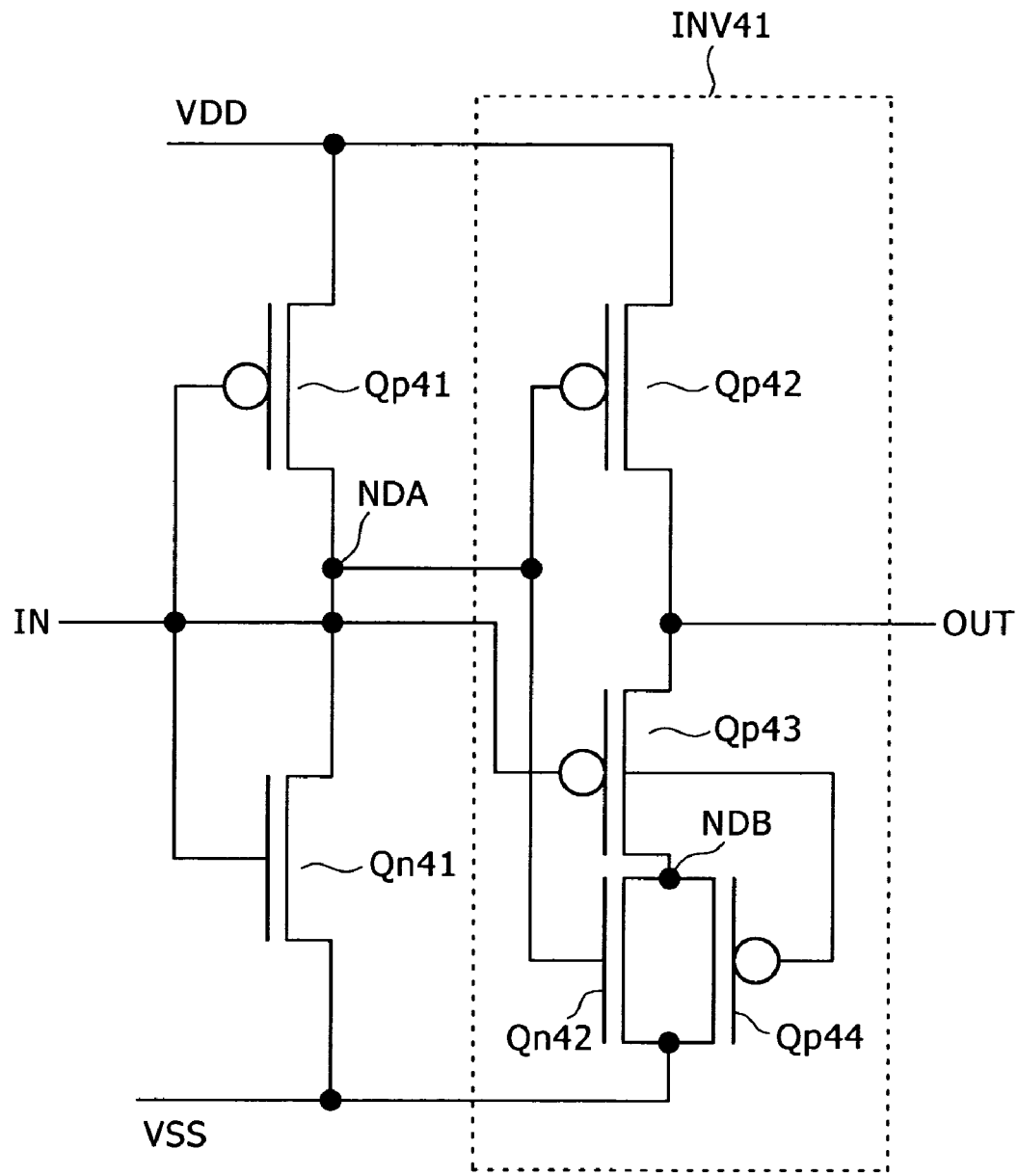
FIG. 7 is a diagram showing a delay buffer circuit using a delay inverter circuit that delays depending on merely the characteristic of Pch Tr according to a first embodiment of the present invention.

FIG. 7 is a diagram showing a delay buffer circuit as a delay circuit using a delay inverter circuit that delays depending on merely the characteristic of Pch Tr according to an embodiment of the present invention.

A delay buffer circuit using a delay inverter will hereinafter be used as an example to facilitate description of the present invention.

A delay buffer circuit 40 according to the present embodiment has a first to a fourth P-channel MOS transistor Qp41 to Qp44 and a first and a second N-channel MOS transistor Qn41 and Qn42.

At this time, a delay inverter circuit INV41 has the P-channel MOS transistors Qp42 to Qp44 and the N-channel MOS transistor Qn42.

A circuit input IN is connected to the gates of the transistors Qp41 and Qn41, and is also connected to the gates of the transistors Qp43 and Qp44 in a next stage. The output of an inverter formed by the transistors Qp41 and Qn41 will be referred to as a node NDA. The node NDA is connected to the gates of the transistors Qp42 and Qn42.

The sources of the transistors Qp41 and Qp42 are connected to a positive side power supply VDD (hereinafter described as a VDD power supply).

The sources of the transistors Qn41 and Qn42 and the drain of the transistor Qp44 are connected to a negative side power supply VSS (hereinafter described as a VSS power supply). The source of the transistor Qp43 is connected to the drain of the transistor Qp42, where a circuit output signal OUT is derived. The drain of the transistor Qp43 is connected to the drain of the transistor Qn42 and the source of the transistor Qp44. A point of connection where the drain of the transistor Qp43 is connected to the drain of the transistor Qn42 and the source of the transistor Qp44 will be referred to as a node NDB.

Figure 1:
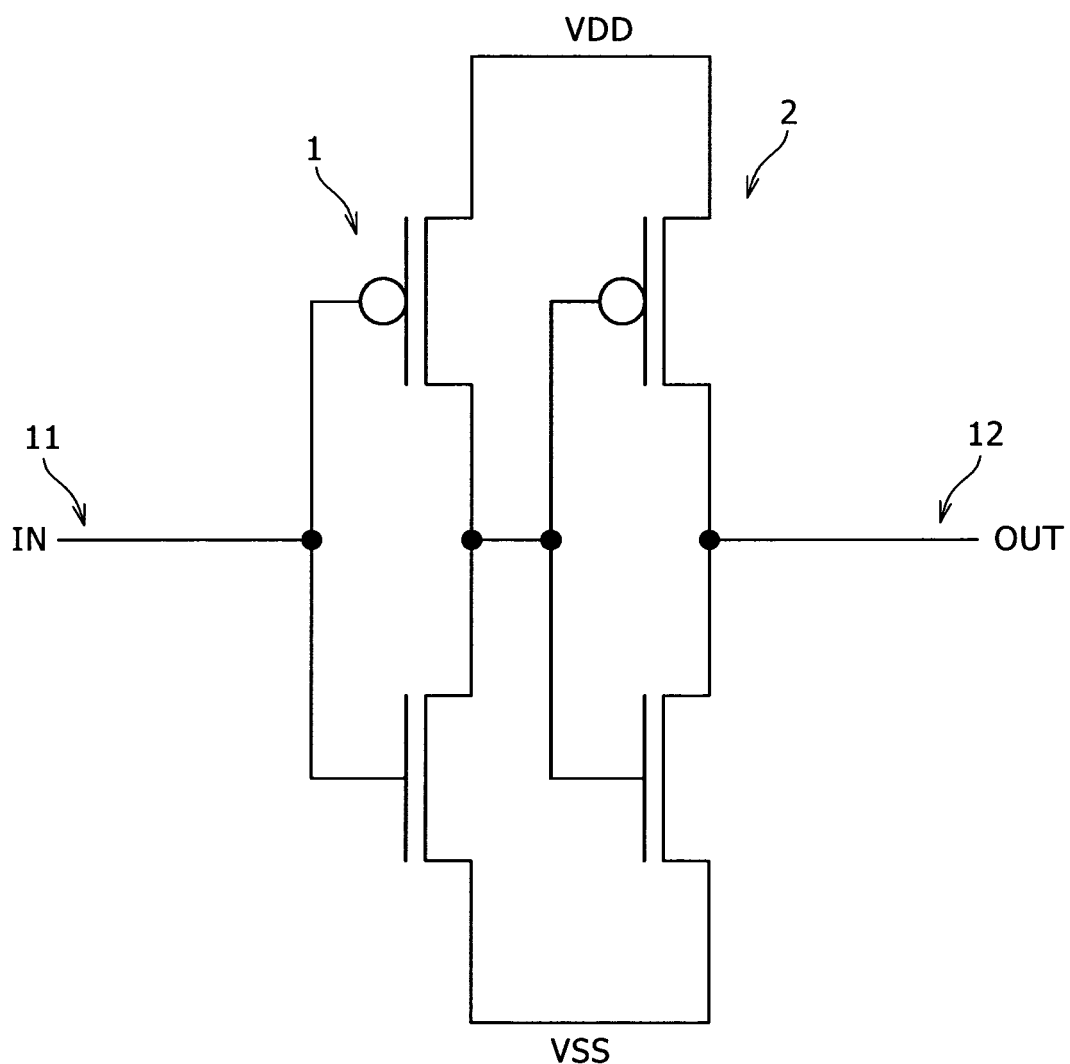
FIG. 1 is a diagram showing a buffer circuit (delay buffer circuit) formed by connecting typical CMOS inverter circuits in two stages to each other.
Figure 2:
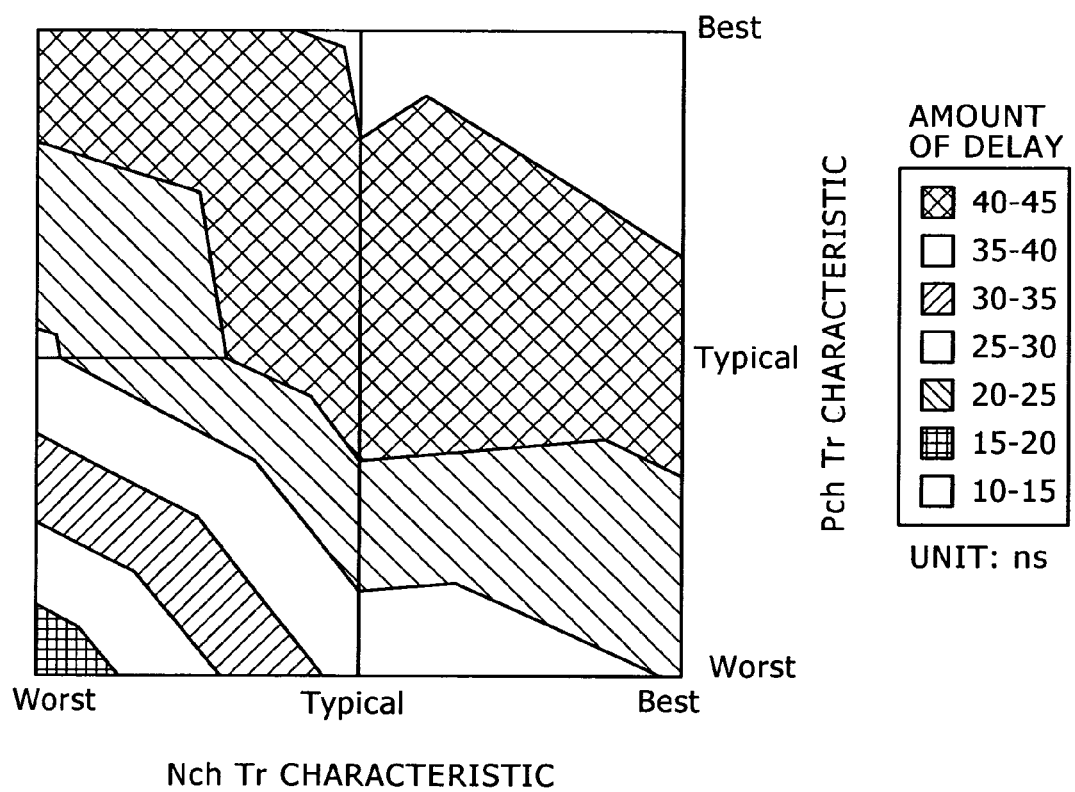
FIG. 2 is a diagram showing a relation between an amount of delay of a delay buffer circuit fabricated by a polysilicon process and characteristics of Nch Tr and Pch Tr.
Figure 4:
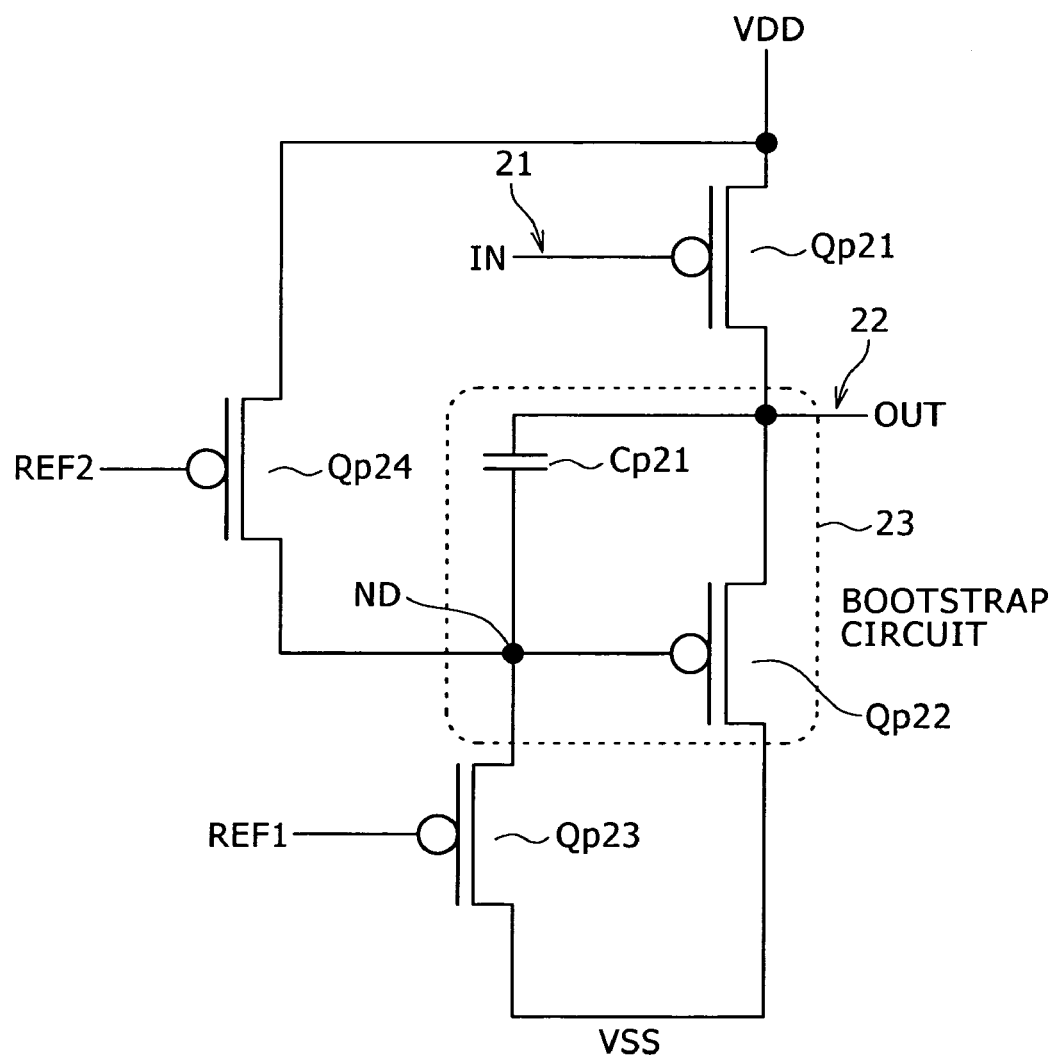
FIG. 4 is a diagram showing a bootstrap type inverter circuit using single-channel transistors (Pch Tr) introduced in Patent Document 1.
Figure 5:
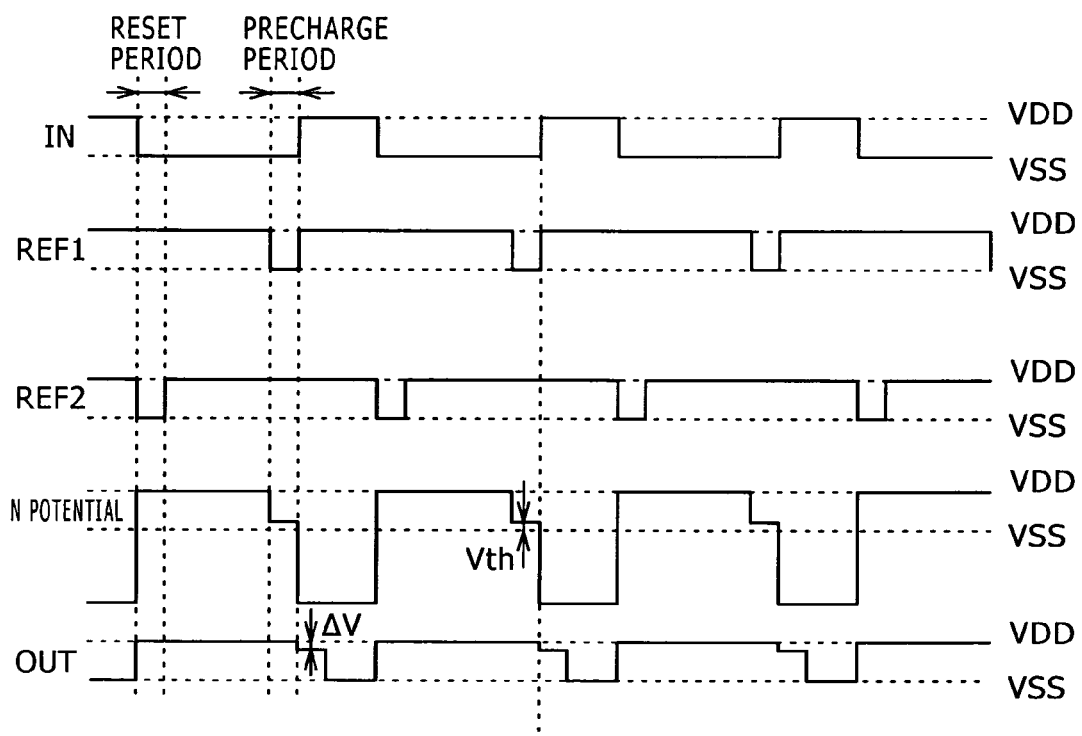
FIG. 5 is a diagram showing the respective levels of and timing relation between an input signal IN, reference signals REF1 and REF2, the potential of a node N, and an output signal OUT in the circuit of FIG. 4.
Figure 6:
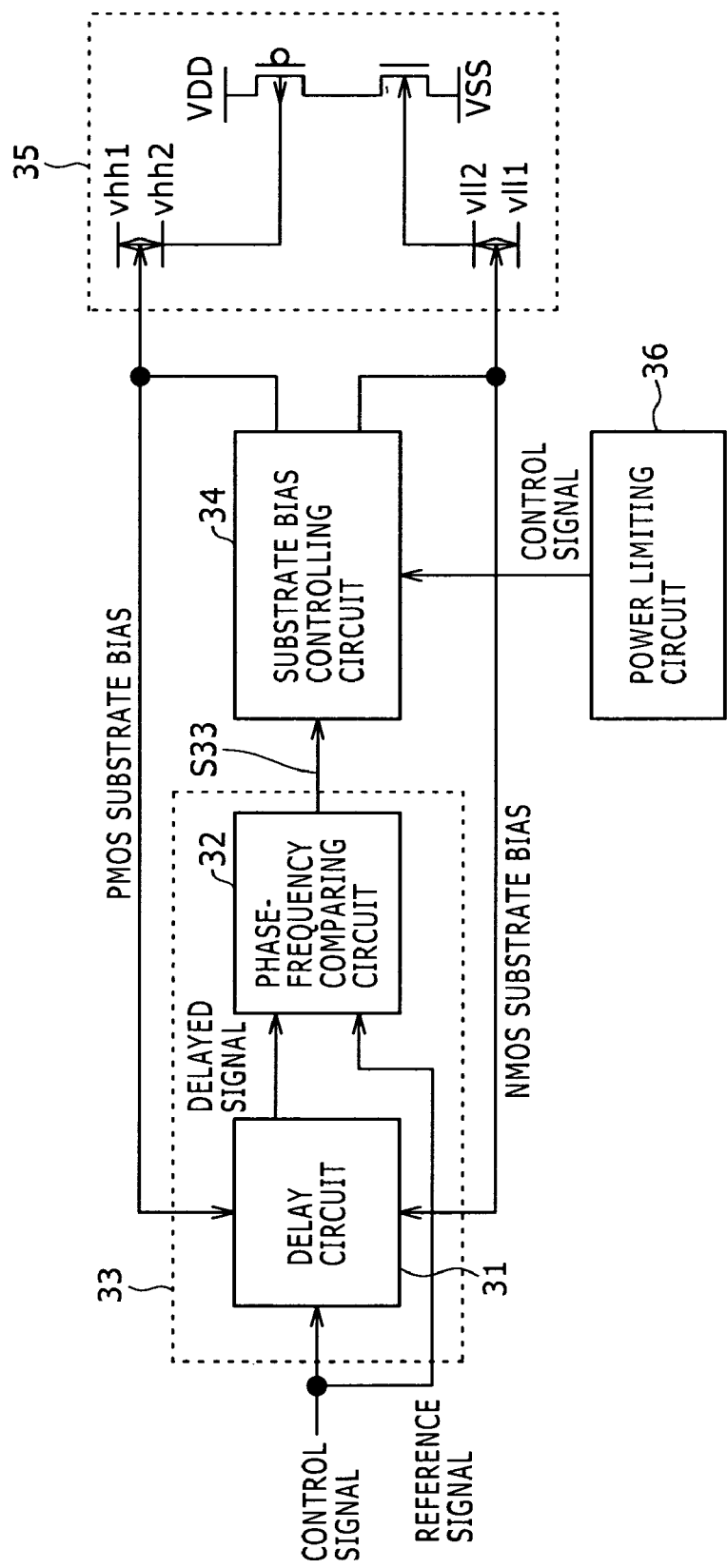
FIG. 6 is a diagram showing an example of configuration of a driving system that reduces power consumption.

Considering a typical CMOS inverter (FIG. 1) as a base, in the present embodiment, the P-channel transistors Qp43 and Qp44 as switch elements are disposed between an output part and a power supply part (VSS in this case).

Figure 8:
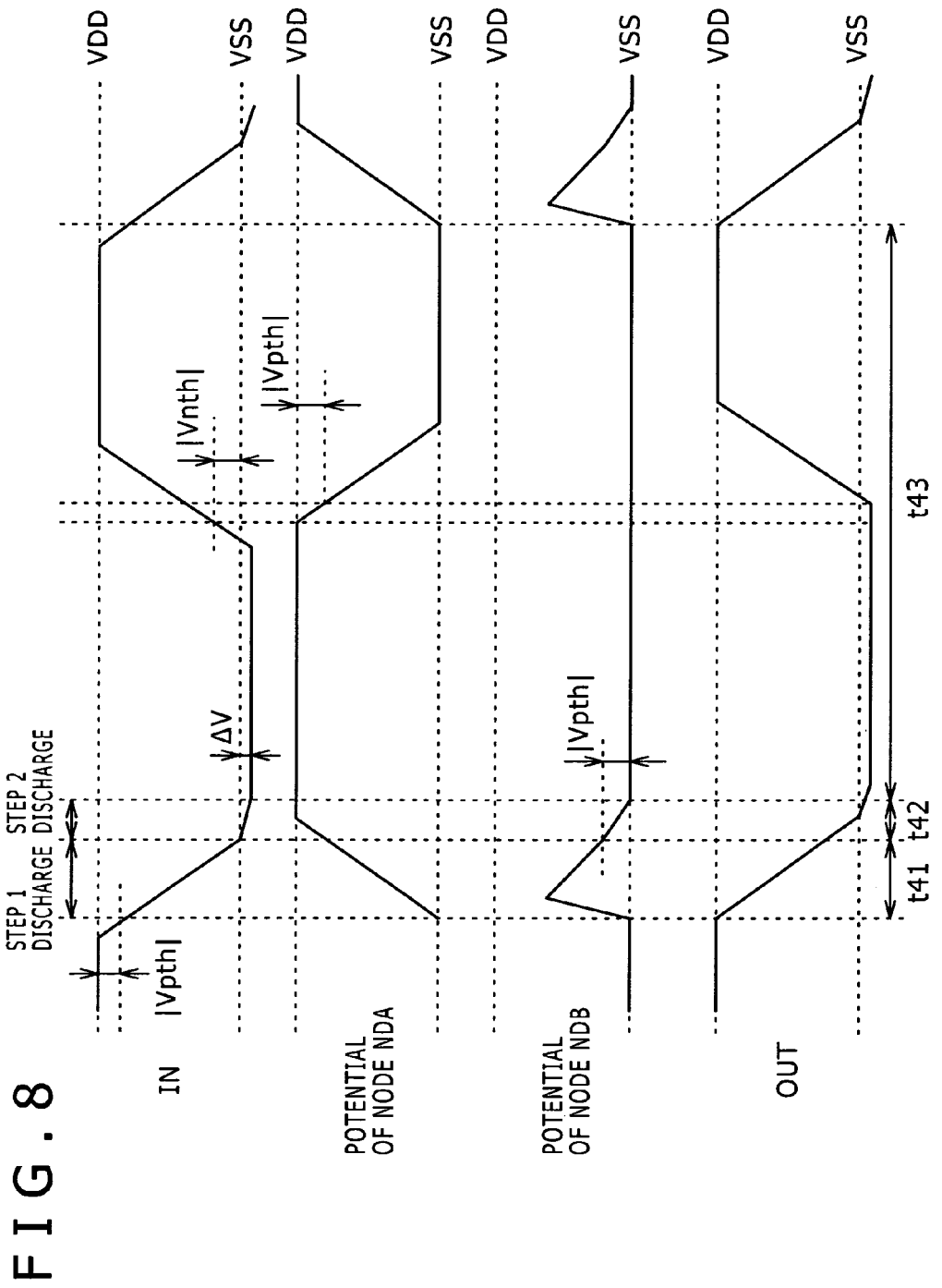
FIG. 8 is a timing chart of assistance in explaining the operation of the delay buffer circuit shown in FIG. 7.

FIG. 8 is a timing chart of assistance in explaining the operation of the delay buffer circuit shown in FIG. 7.

In period t41, the transistor Qp41 is turned on at a point in time that VDD−|Vpth| is reached when a circuit input signal IN starts changing from a VDD level to a VSS level. The potential of the node NDA is raised from the VSS level, and at the same time, the transistors Qp43 and Qp44 are similarly turned on. The node NDB and an OUT potential are thus short-circuited. The potential of the node NDB is raised to the potential of the output signal OUT while a discharge to the VSS power supply is performed. This period t41 will be referred to as a step 1 discharge period.

In next period t42, when the input signal IN is lowered to the VSS level, the node NDB and the output signal OUT are short-circuited, and thus the node NDB is VSS+|Vpth| at the lowest (the on resistance of the transistor Qp43 is set sufficiently lower than the on resistance of a CMOS switch formed by the transistors Qn42 and Qp44).

Because the node NDA is at the VDD level, the transistor Qn42 is turned on, and the potential of the node NDB continues being further lowered to the VSS level.

There are some parasitic capacitances (for example the gate-to-drain capacitance Cgd of the transistor Qp43 and the gate-to-source capacitance Cgs of the transistor Qp44) between the input signal IN and the node NDB. Subjected to the coupling of these parasitic capacitances, the potential of the input signal IN is lowered to a potential lower than the VSS level.

In addition, due to the source-to-drain capacitance Csd of the transistor Qp43, the output OUT is also lowered by a change in potential of the node NDB. Similarly, the input signal IN is lowered due to the source-to-drain capacitance Csd of a transistor in an output part in a preceding stage. Suppose that an amount by which the input signal IN is lowered is ΔV. It can be said that ΔV depends on merely a P-channel transistor characteristic. This period t42 will be referred to as a step 2 discharge period.

According to the above description, by providing the step 1 and step 2 discharge periods in two stages, a delay in the falling timing of the output signal OUT with respect to the falling timing of the input signal IN can be made substantially dependent on merely the characteristic of the P-channel transistor. In period t43, the transistor Qn41 is turned on when a level of VSS+|Vnth| is reached while the input signal IN is changing from the VSS level to the VDD level. The node NDA is thereby lowered. When the potential of the node NDA is lowered to a level of VDD−|Vpth|, the transistor Qp42 is turned on, and the output OUT is thereby raised. Hence, an amount of delay in the rising timing of the output signal OUT with respect to the rising timing of the input signal IN depends on the characteristics of both Pch Tr and Nch Tr. However, this does not present a problem, because an amount of delay in the falling timing is dependent on merely the characteristic of one transistor, and is thus sufficient to detect the characteristic of the transistor formed on an insulative substrate.

Figure 9:
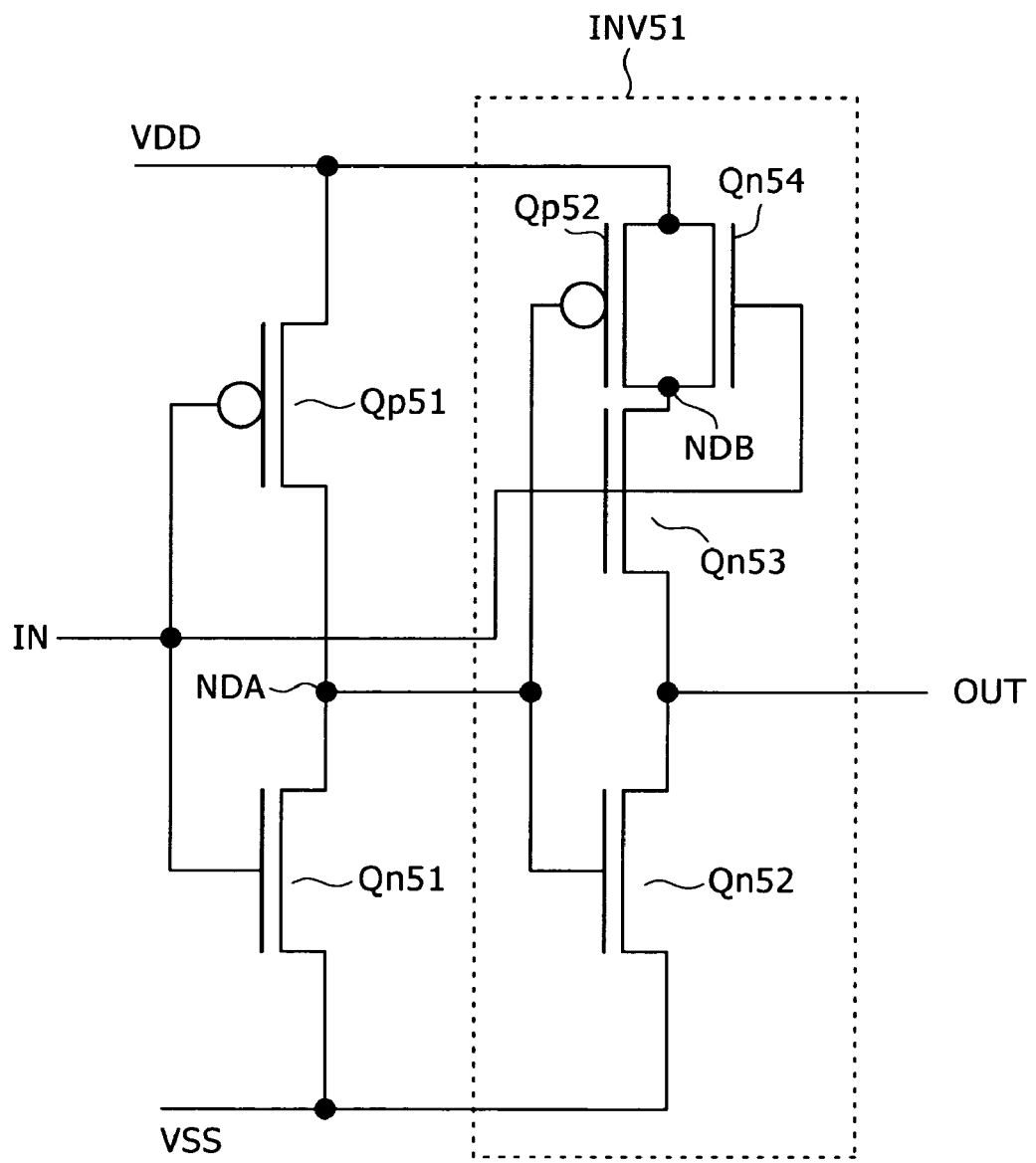
FIG. 9 is a diagram showing a delay buffer circuit using a delay inverter circuit that delays depending on merely the characteristic of Nch Tr according to a second embodiment of the present invention.

FIG. 9 is a diagram showing a delay buffer circuit that delays depending on merely the characteristic of Nch Tr according to a second embodiment of the present invention.

A delay buffer circuit 50 according to the present embodiment has a first to a fourth N-channel MOS transistor Qn51 to Qn54 and a first and a second P-channel MOS transistor Qp51 and Qp52.

At this time, a delay inverter circuit INV51 has the N-channel MOS transistors Qn52 to Qn54 and the P-channel MOS transistor Qp52.

A circuit input IN is connected to the gates of the transistors Qn51 and Qp51, and is also connected to the gates of the transistors Qn53 and Qn54 in a next stage. The output of an inverter formed by the transistors Qn51 and Qp51 will be referred to as a node NDA. The node NDA is connected to the gates of the transistors Qn52 and Qp52.

The sources of the transistors Qn51 and Qn52 are connected to a negative side power supply VSS. The sources of the transistors Qp51 and Qp52 and the drain of the transistor Qn54 are connected to a positive side power supply VDD.

The source of the transistor Qn53 is connected to the drain of the transistor Qn52, where a circuit output signal OUT is derived. The drain of the transistor Qn53 is connected to the drain of the transistor Qp52 and the source of the transistor Qn54. A point of connection where the drain of the transistor Qn53 is connected to the drain of the transistor Qp52 and the source of the transistor Qn54 will be referred to as a node NDB.

Figure 10:
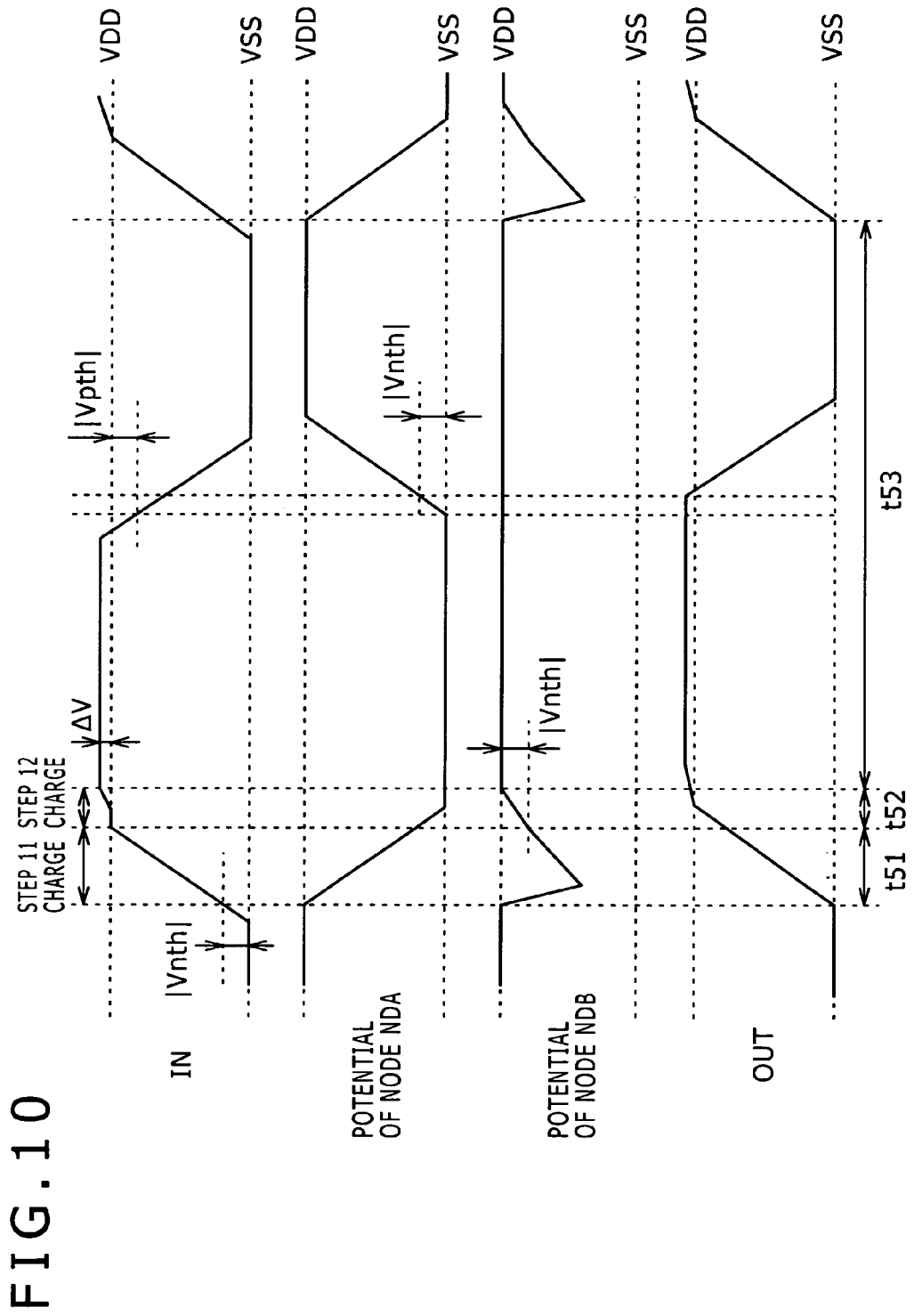
FIG. 10 is a timing chart of assistance in explaining the operation of the delay buffer circuit shown in FIG. 9.

FIG. 10 is a timing chart of assistance in explaining the operation of the delay buffer circuit shown in FIG. 9.

In period t51, the transistor Qn51 is turned on at a point in time that VSS+|Vnth| is reached when a circuit input signal IN starts changing from a VSS level to a VDD level. The potential of the node NDA is lowered from the VDD level, and at the same time, the transistors Qn53 and Qn54 are similarly turned on. The node NDB and an OUT potential are thus short-circuited. The potential of the node NDB is lowered to the potential of the output signal OUT while a charge from the VDD power supply is performed. This period t51 will be referred to as a step 11 charge period.

In next period t52, when the input signal IN is raised to the VDD level, the node NDB and the output signal OUT are short-circuited, and thus the potential of the node. NDB is VDD−|Vnth| at the highest (the on resistance of the transistor Qn53 is set sufficiently lower than the on resistance of a CMOS switch formed by the transistors Qn54 and Qp52).

Because the node NDA is at the VSS level, the transistor Qp52 is turned on, and the potential of the node NDB continues being further raised to the VDD level.

There are some parasitic capacitances (for example the gate-to-drain capacitance Cgd of the transistor Qn53 and the gate-to-source capacitance Cgs of the transistor Qn54) between the input signal IN and the node NDB. Subjected to the coupling of these parasitic capacitances, the potential of the input signal IN is raised to a potential higher than the VDD level.

In addition, due to the source-to-drain capacitance Csd of the transistor Qn53, the output OUT is also raised by a change in potential of the node NDB. Similarly, the input signal IN is raised due to the source-to-drain capacitance Csd of a transistor in an output part in a preceding stage. Suppose that an amount by which the input signal IN is raised is ΔV. It can be said that ΔV depends on merely an N-channel transistor characteristic. This period t52 will be referred to as a step 21 charge period.

Thus, by providing the step 11 and step 12 charge periods, a delay in the rising timing of the output signal OUT with respect to the rising timing of the input signal IN can be said to be substantially dependent on merely the characteristic of the N-channel transistor.

In period t53, the transistor Qp51 is turned on when a level of VDD−|Vpth| is reached while the input signal IN is changed from the VDD level to the VSS level. The node NDA is thereby raised.

When the potential of the node NDA is raised to a level of VSS+|Vnth|, the transistor Qn52 is turned on, and the output OUT is thereby lowered. Hence, an amount of delay in the falling timing of the output signal OUT with respect to the falling timing of the input signal IN depends on the characteristics of both Pch Tr and Nch Tr.

However, this does not present a problem, because an amount of delay in the rising timing is dependent on merely the characteristic of one transistor, and is thus sufficient to detect the characteristic of the transistor formed on an insulative substrate.

The first and second embodiments of the present invention have been described above. The delay buffer circuits that delay depending on merely a one-channel transistor characteristic irrespective of the configuration of the CMOS transistor circuit can be fabricated. An example of modification will be shown on the basis of the embodiments.

According to a use, when the characteristics of both a P-channel transistor and an N-channel transistor are desired to be detected, for example, a delay buffer dependent on merely the characteristic of the N-channel transistor and a delay buffer dependent on merely the characteristic of the P-channel transistor are necessary.

By combining the first embodiment and the second embodiment described above, it is possible to detect the characteristics of transistors of both channel types with one delay buffer (number of elements: eight transistors).

When the technique of the already introduced Patent Document 1 is used, sixteen transistors and four capacitances are necessary as elements of a buffer for both an N-channel transistor and a P-channel transistor. If M buffers are to be used, M×(eight transistors+four capacitances) can be omitted from a viewpoint of the number of elements.

Figure 11:
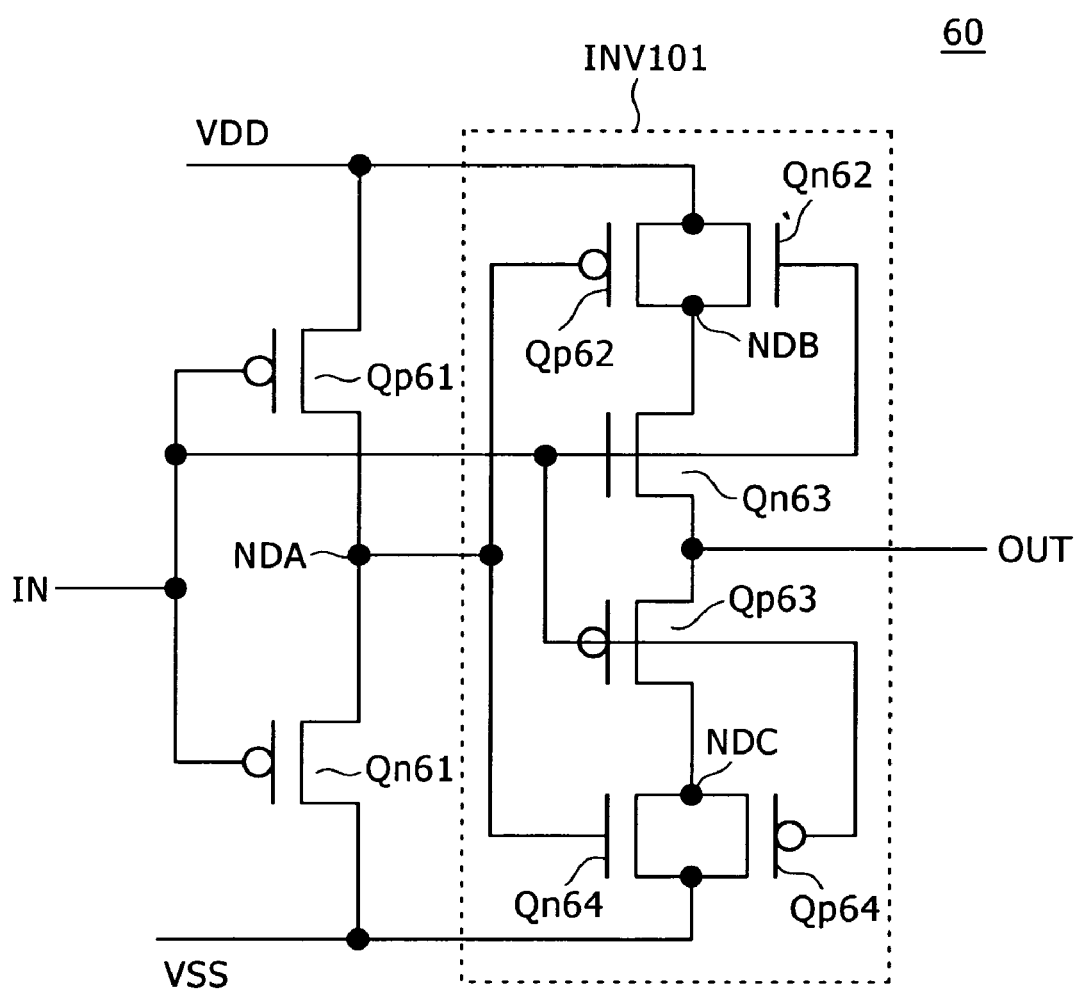
FIG. 11 is a diagram showing a delay buffer circuit that delays depending on each of the characteristic of Pch Tr and the characteristic of Nch Tr independently, the delay buffer circuit being an example of modification of the delay buffer circuits according to the embodiments of the present invention.

FIG. 11 is a diagram showing a delay buffer circuit that delays depending on each of the characteristic of Pch Tr and the characteristic of Nch Tr independently, the delay buffer circuit being an example of modification of the delay buffer circuits according to the embodiments of the present invention.

A delay buffer circuit 60 according to the present modification example has a first to a fourth P-channel MOS transistor Qp61 to Qp64 and a first to a fourth N-channel MOS transistor Qn61 to Qn64.

At this time, a delay inverter circuit INV61 has the N-channel MOS transistors Qn62 to Qn64 and the P-channel MOS transistors Qp62 to Qp64.

A circuit input IN is connected to the gates of the transistors Qp61 and Qn61, and is also connected to the gates of the transistors Qp63, Qp64, Qn62, and Qn63 in a next stage.

The output of an inverter formed by the transistors Qp61 and Qn61 will be referred to as a node NDA. The node NDA is connected to the gates of the transistors Qp62 and Qn64.

The sources of the transistors Qp61 and Qp62 and the drain of the transistor Qn62 are connected to a positive side power supply VDD. The sources of the transistors Qn61 and Qn64 and the drain of the transistor Qp64 are connected to a negative side power supply VSS.

The source of the transistor Qp63 is connected to the source of the transistor Qn63. The drain of the transistor Qp63 is connected to the drain of the transistor Qn64 and the source of the transistor Qp64. A point of connection where the drain of the transistor Qp63 is connected to the drain of the transistor Qn64 and the source of the transistor Qp64 will be referred to as a node NDC.

The source of the transistor Qn63 is connected to the source of the transistor Qp63. The drain of the transistor Qn63 is connected to the drain of the transistor Qp62 and the source of the transistor Qn62. A point of connection where the drain of the transistor Qn63 is connected to the drain of the transistor Qp62 and the source of the transistor Qn62 will be referred to as a node NDB.

A circuit output signal terminal OUT is wiring connecting the source of the transistor Qn63 and the source of the transistor Qp63 to each other.

Figure 12:
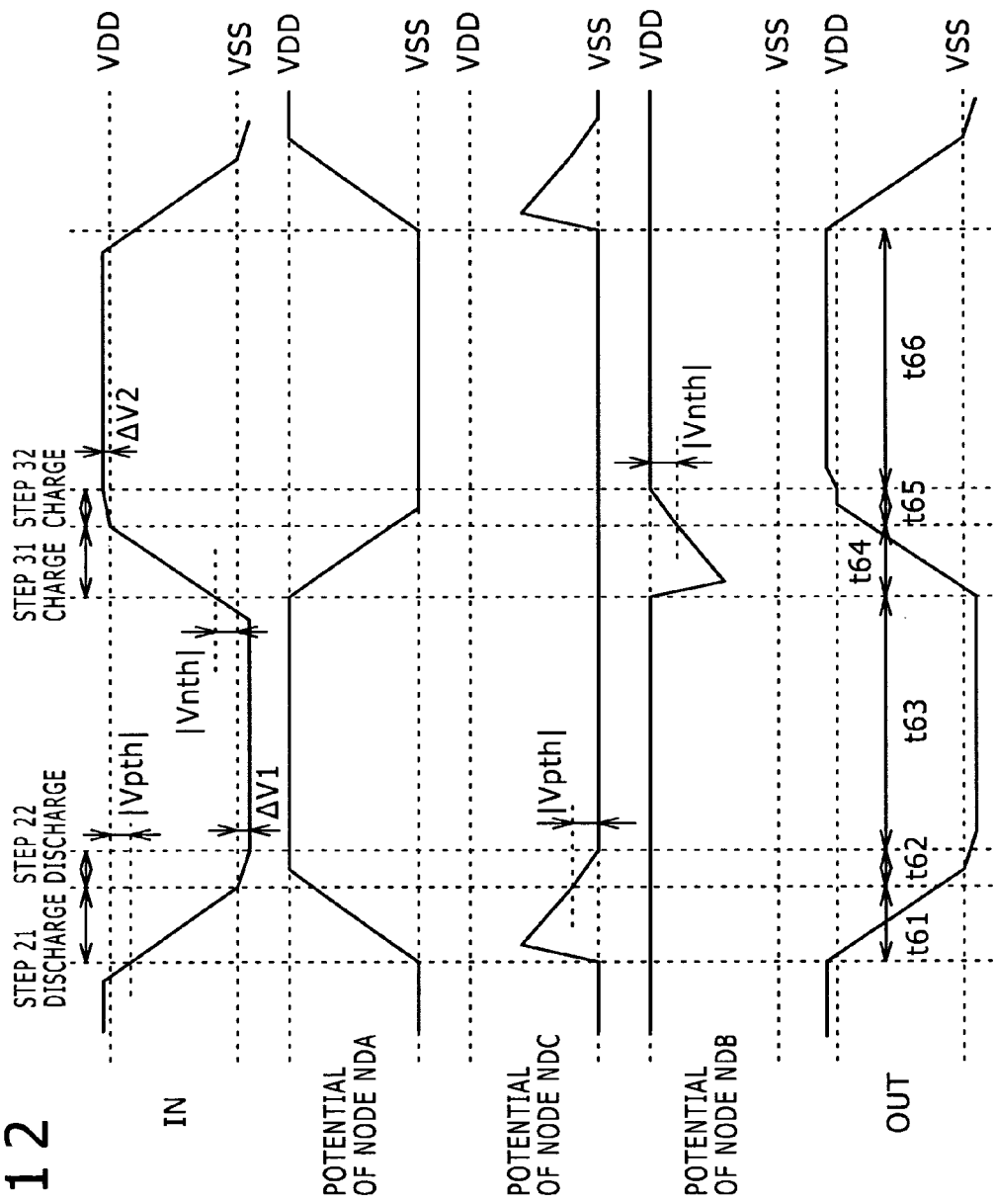
FIG. 12 is a timing chart of assistance in explaining the operation of the delay buffer circuit shown in FIG. 11.

FIG. 12 is a timing chart of assistance in explaining the operation of the delay buffer circuit shown in FIG. 11.

In period t61, the transistor Qp61 is turned on at a point in time that VDD−|Vpth| is reached when a circuit input signal IN starts changing from a VDD level to a VSS level. The potential of the node NDA is raised from the VSS level, and at the same time, the transistors Qp63 and Qp64 are similarly turned on. The node NDC and an OUT potential are thus short-circuited. The potential of the node NDC is raised to the potential of the output signal OUT while a discharge to the VSS power supply is performed. This period t61 will be referred to as a step 21 discharge period.

In next period t62, when the input signal IN is lowered to the VSS level, the node NDC and the output signal OUT are short-circuited, and thus the node NDC is VSS+|Vpth| at the lowest (the on resistance of the transistor Qp63 is set sufficiently lower than the on resistance of a CMOS switch formed by the transistors Qn64 and Qp64). Because the node NDA is at the VDD level, the transistor Qn64 is turned on, and the potential of the node NDC continues being further lowered to the VSS level.

There are some parasitic capacitances (for example the gate-to-drain capacitance Cgd of the transistor Qp63 and the gate-to-source capacitance Cgs of the transistor. Qp64) between the input signal IN and the node NDC. Subjected to the coupling of these parasitic capacitances, the potential of the input signal IN is lowered to a potential lower than the VSS level.

In addition, due to the source-to-drain capacitance Csd of the transistor Qp63, the output OUT is also lowered by a change in potential of the node NDC.

Similarly, the input signal IN is lowered due to the source-to-drain capacitance Csd of a transistor in an output part in a preceding stage. Suppose that an amount by which the input signal IN is lowered is ΔV1. It can be said that ΔV1 depends on merely a P-channel transistor characteristic. This period t62 will be referred to as a step 22 discharge period.

Thus, by providing the step 21 and step 22 discharge periods, a delay in the falling timing of the output signal OUT with respect to the falling timing of the input signal IN can be said to be substantially dependent on merely the characteristic of the P-channel transistor.

Period t63 is a period in which the state of the potentials changed in period t62 is maintained. The input signal IN is VSS−ΔV1 (ΔV1>0). The node NDA is at the VDD level. The node NDC is at the VSS level. The output signal OUT is VSS−ΔV1 (ΔV1>0).

In period t64, the transistor Qn61 is turned on at a point in time that VSS+|Vnth| is reached when the circuit input signal IN starts changing from the VSS level to the VDD level. The potential of the node NDA is lowered from the VDD level, and at the same time, the transistors Qn63 and Qn64 are similarly turned on. The node NDB and the OUT potential are thus short-circuited. The potential of the node NDB is lowered to the potential of the output signal OUT while a charge from the VDD power supply is performed. This period t64 will be referred to as a step 31 charge period.

In next period t65, when the input signal IN is raised to the VDD level, the node NDB and the output signal OUT are short-circuited, and thus the potential of the node NDB is VDD−|Vnth| at the highest (the on resistance of the transistor Qn63 is set sufficiently lower than the on resistance of a CMOS switch formed by the transistors Qn62 and Qp62).

Because the node NDA is at the VSS level, the transistor Qp62 is turned on, and the potential of the node NDB continues being further raised to the VDD level. There are some parasitic capacitances (for example the gate-to-drain capacitance Cgd of the transistor Qn63 and the gate-to-source capacitance Cgs of the transistor Qn62) between the input signal IN and the node NDB. Subjected to the coupling of these parasitic capacitances, the potential of the input signal IN is raised to a potential higher than the VDD level.

In addition, due to the source-to-drain capacitance Csd of the transistor Qn63, the output OUT is also raised by a change in potential of the node NDB.

Similarly, the input signal IN is raised due to the source-to-drain capacitance Csd of a transistor in an output part in a preceding stage. Suppose that an amount by which the input signal IN is raised is ΔV2. It can be said that ΔV2 depends on merely an N-channel transistor characteristic. This period t65 will be referred to as a step 32 charge period.

Thus, by providing the step 31 and step 32 charge periods, a delay in the rising timing of the output signal OUT with respect to the rising timing of the input signal IN can be said to be substantially dependent on merely the characteristic of the N-channel transistor.

The example of modification described above is a delay buffer that can detect the respective characteristics of a P-channel transistor and an N-channel transistor as one delay buffer and represent the respective characteristics of the P-channel transistor and the N-channel transistor as amounts of delay.

A simple configuration, a small layout area, a delay inverter circuit having a characteristic of delaying depending on merely one transistor type (Pch Tr or Nch Tr), and a case of using the delay inverter in a delay buffer according to the embodiment of the present invention have been described as an example. However, the embodiment of the present invention is not limited to this. The embodiment of the present invention is applicable to circuits in general that do not delay depending on merely the characteristic of one transistor in circuit operation as well as to the delay buffer according to the embodiment of the present invention.

In addition, the embodiment of the present invention is not limited to a circuit using polysilicon formed on an insulating substrate. The embodiment of the present invention is applicable to circuits in general that use defective silicon.

As described above, according to the present embodiment, a plurality of switch elements are inserted between an output part and a power supply, and an output potential is discharged (charged) in two stages by these switch elements.

As a result, it is possible to achieve a simple circuit configuration, space saving, and high accuracy because capacitances known to have large variations are not used.

In addition, because a delay can be produced depending on merely the characteristic of one transistor, there are many and various applications such for example as an application in which the transistor characteristic of a circuit formed on a same insulating substrate is detected and fed back to a power supply voltage and all control signals, and the control signals respond with variations in the transistor characteristic. Therefore an improvement in yield (reduction in cost), an improvement in performance (high reliability) and the like can be expected.

Description will next be made of a semiconductor control circuit that can employ a delay buffer circuit (delay circuit) as described above and which is formed on an insulating substrate of a display device integral with a driving circuit.

As described above, in a polysilicon process or an amorphous silicon process for TFTs formed on an insulating substrate of a display device integral with a driving circuit, variations in transistor characteristics such as threshold voltage Vth, mobility μ and the like are larger than in a single-crystal process. Thus, in making a design, transistor size is increased or the level of driving power supply voltage is raised to secure a sufficient operating margin for the large variations. Thus, for example an increase in power consumption and a large frame due to the large transistor size become a problem.

A semiconductor control circuit that makes it possible to achieve a reduced power consumption and a narrow frame at the same time by accommodating the variations and reducing the margin as much as possible will be described as present embodiment.

Figure 13:
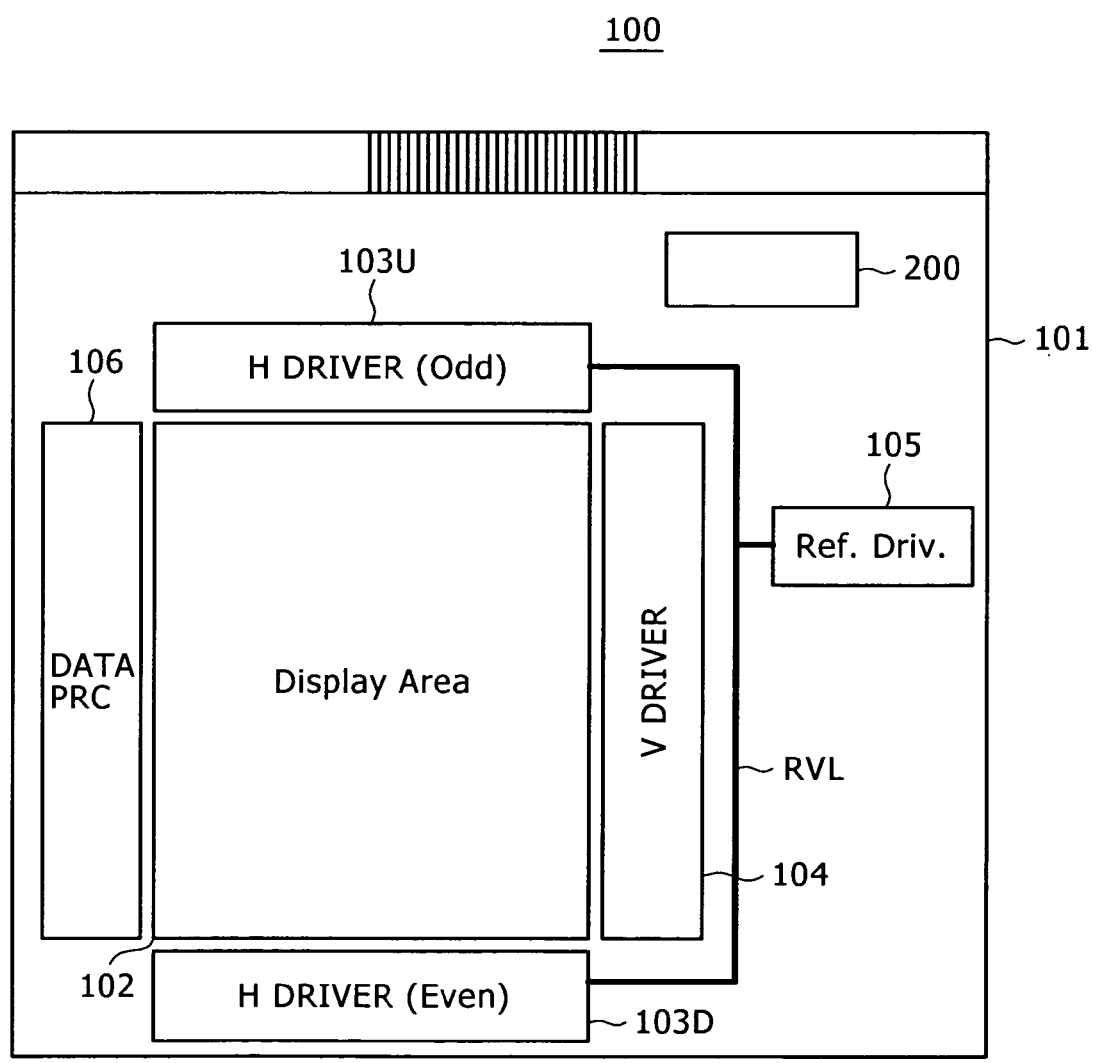
FIG. 13 is a diagram showing a general configuration of a display device integral with a driving circuit.

FIG. 13 is a diagram showing a general configuration of a display device integral with a driving circuit.

As shown in FIG. 13, this liquid crystal display device 100 is formed by integrating, on a transparent insulating substrate, for example a glass substrate 101, an effective display section 102 in which a plurality of pixels including a liquid crystal cell are arranged in the form of a matrix, a pair of horizontal driving circuits (H drivers) 103U and 103D arranged on an upper side and a lower side of the effective display section 102 in FIG. 13, a vertical driving circuit (V driver) 104 disposed on a side of the effective display section 102 in FIG. 13, one reference voltage generating circuit 105 for generating a plurality of reference voltages, a data processing circuit 106, a semiconductor control circuit 200 and the like.

Thus, the driving circuit-integrated display device 100 of FIG. 13 has the two horizontal driving circuits 103U and 103D arranged on both sides (the upper side and the lower side in FIG. 13) of the effective display section 102. This is to drive odd-numbered lines and even-numbered lines of data lines separately from each other.

While FIG. 13 shows the semiconductor control circuit 200 provided separately from the other circuits, the reference voltage generating circuit 105 and the data processing circuit 106 can be applied as circuits to be controlled by the semiconductor control circuit 200 to be described below.

The configuration and functions of the semiconductor control circuit 200 will be described in the following.

Figure 14:
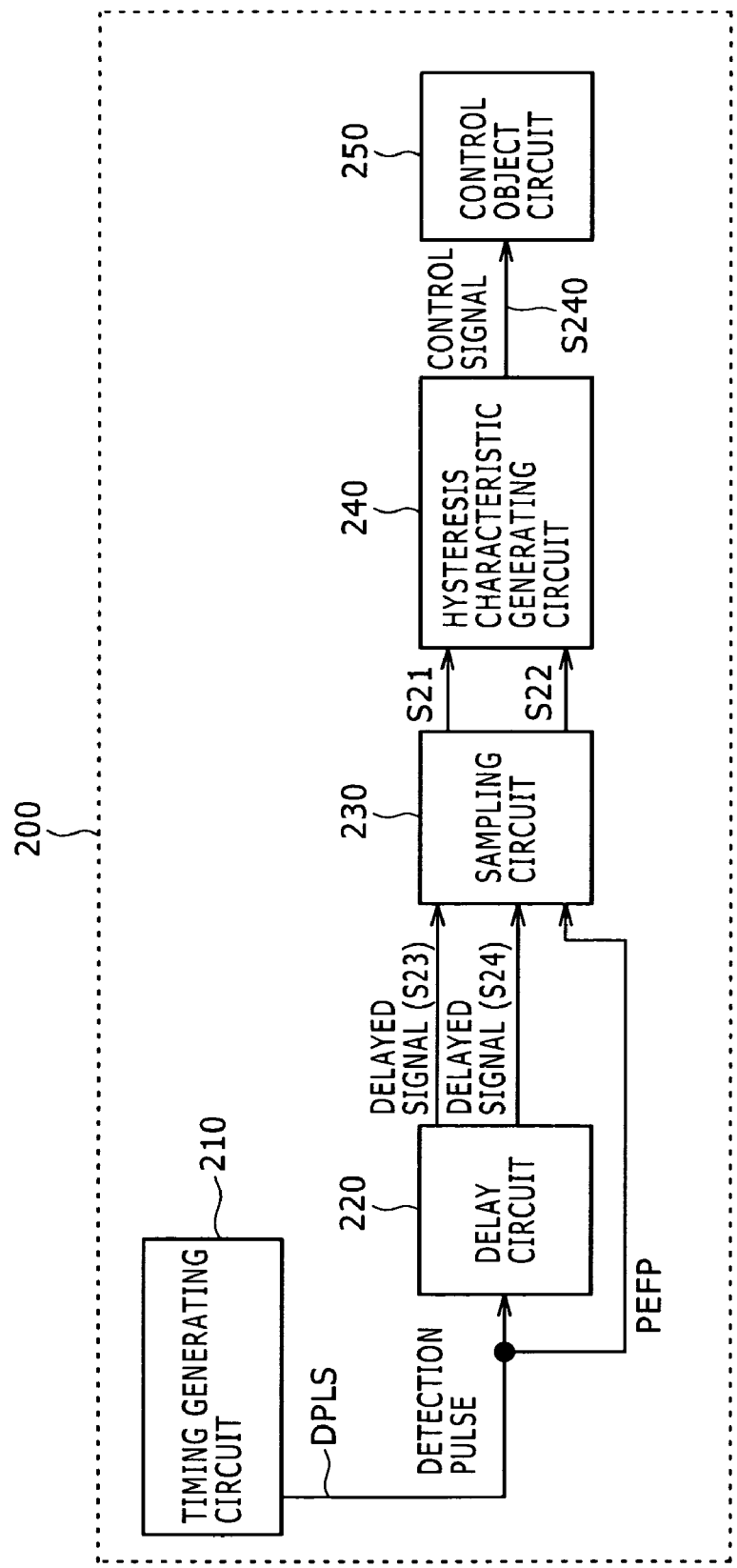
FIG. 14 is a block diagram showing the configuration of a semiconductor control circuit according to an embodiment of the present invention.

FIG. 14 is a block diagram showing the configuration of a semiconductor control circuit according to an embodiment of the present invention.

As shown in FIG. 14, the semiconductor control circuit 200 includes a timing generating circuit 210, a delay circuit 220, a sampling circuit 230, a hysteresis characteristic generating circuit 240, and a control object circuit 250.

In the semiconductor control circuit 200, a detection pulse DPLS generated from the timing generating circuit 210 is input as a reference pulse REFP to the delay circuit 220 and the phase-frequency comparing circuit (that is for example a sampling circuit, and which circuit will hereinafter be referred to as a "sampling circuit") 230.

Delayed signals S23 and S24 as output signals of the delay circuit 220 are each sampled, and then signals S21 and S22 are output.

The signals S21 and S22 are passed through the hysteresis characteristic generating circuit 240, and then a sampled waveform having a hysteresis characteristic is sent as a control signal to various control object circuits 250.

A general driving concept will first be described.

Figure 15:
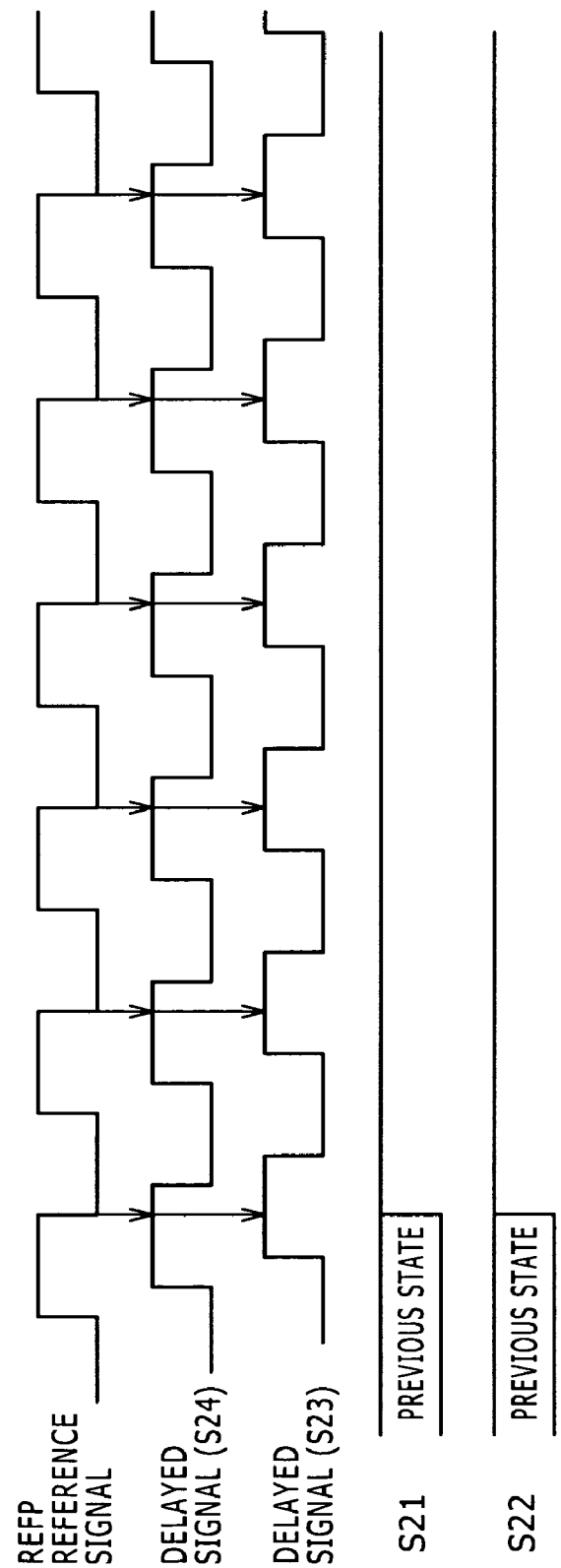
FIG. 15 is a timing chart of the semiconductor control circuit of FIG. 14.

FIG. 15 is a timing chart of the semiconductor control circuit of FIG. 14.

The detection pulse DPLS generated by the timing generating circuit 210 is input to the delay circuit 220. For example, in a case where a sampling trigger is a falling edge of a reference signal, when transistor characteristics (voltage Vth, drain-to-source current and the like) are good, the delayed signals have small amounts of delay, and the sampled signals S21 and S22 are at a high level.

Suppose in this case that the number of delay buffers within the delay circuit 220 through which the delayed signal S23 is passed is larger than the number of delay buffers for the signal S24.

A hysteresis characteristic is provided to control by using a difference between the numbers of delay buffers. A detailed example will be described later.

A power supply voltage generating circuit, a DD converter circuit, an analog buffer circuit, a data processing circuit, and a reference voltage generating circuit, for example, are applied as control object circuits 250.

In the present embodiment, unlike the existing techniques, a substrate bias is not used (which is applicable to a polysilicon process or an amorphous silicon process), and a hysteresis characteristic is provided, so that a stable output value is obtained.

Other advantages, such as lower power consumption related to a capability of the display device, a narrower frame, and an improvement in yield and correction mask reduction leading to a reduction in cost of the display device, are obtained.

Description will be made below of a more concrete configuration, functions, and an example of modification.

Figure 16:
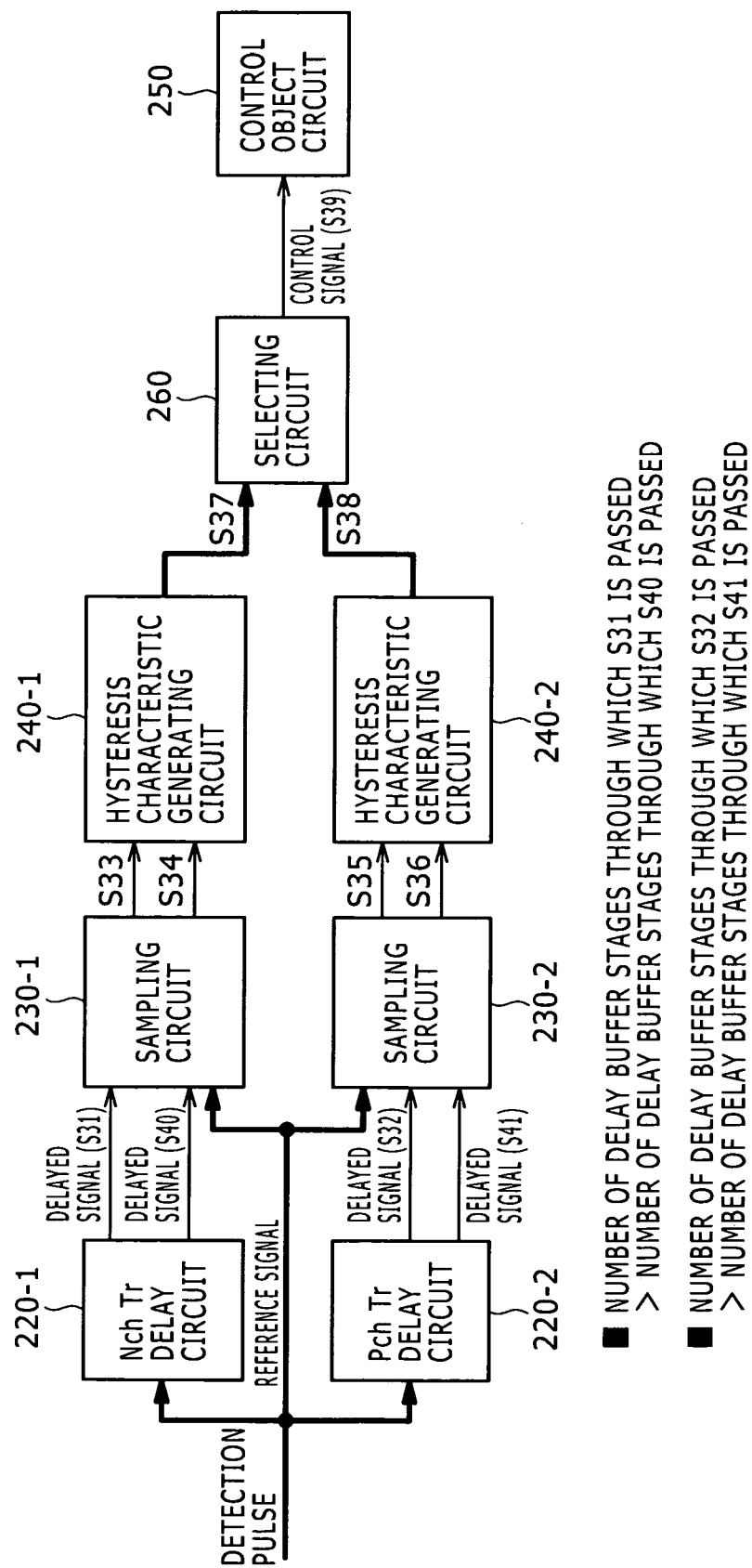
FIG. 16 is a circuit diagram showing an example of configuration in a case where the characteristic of a P-channel transistor and the characteristic of an N-channel transistor are detected separately from each other to perform control.

FIG. 16 is a circuit diagram showing an example of configuration in a case where the characteristic of a P-channel transistor and the characteristic of an N-channel transistor are detected separately from each other to perform control.

There is a case where merely one channel is desired to be detected (sensed) by a control object circuit 250.

Delayed signals S31 and S40 delayed by a delay circuit 220-1 depending on the characteristic of an N-channel transistor are each sampled by a sampling circuit 230-1, and then signals S33 and S34 are output by the sampling circuit 230-1. The signals S33 and S34 are supplied to a hysteresis characteristic generating circuit 240-1, and then a signal S37 is input to a selecting circuit 260.

Similarly, delayed signals S32 and S41 delayed by a delay circuit 220-2 depending on the characteristic of a P-channel transistor are each sampled by a sampling circuit 230-2, and then signals S35 and S36 are output by the sampling circuit 230-2. The signals S35 and S36 are supplied to a hysteresis characteristic generating circuit 240-2, and then a signal S38 is input to the selecting circuit 260.

The selecting circuit 260 selects as to whether to consider both the characteristic of the P-channel transistor and the characteristic of the N-channel transistor or consider merely the characteristic of one transistor channel (for example a case where merely the characteristic of the P-channel transistor is desired to be detected). An output selected by the selecting circuit 260 is sent as a control signal S39 to the control object circuit 250.

Of course, the selecting circuit may be unnecessary according to a use.

Figure 17:
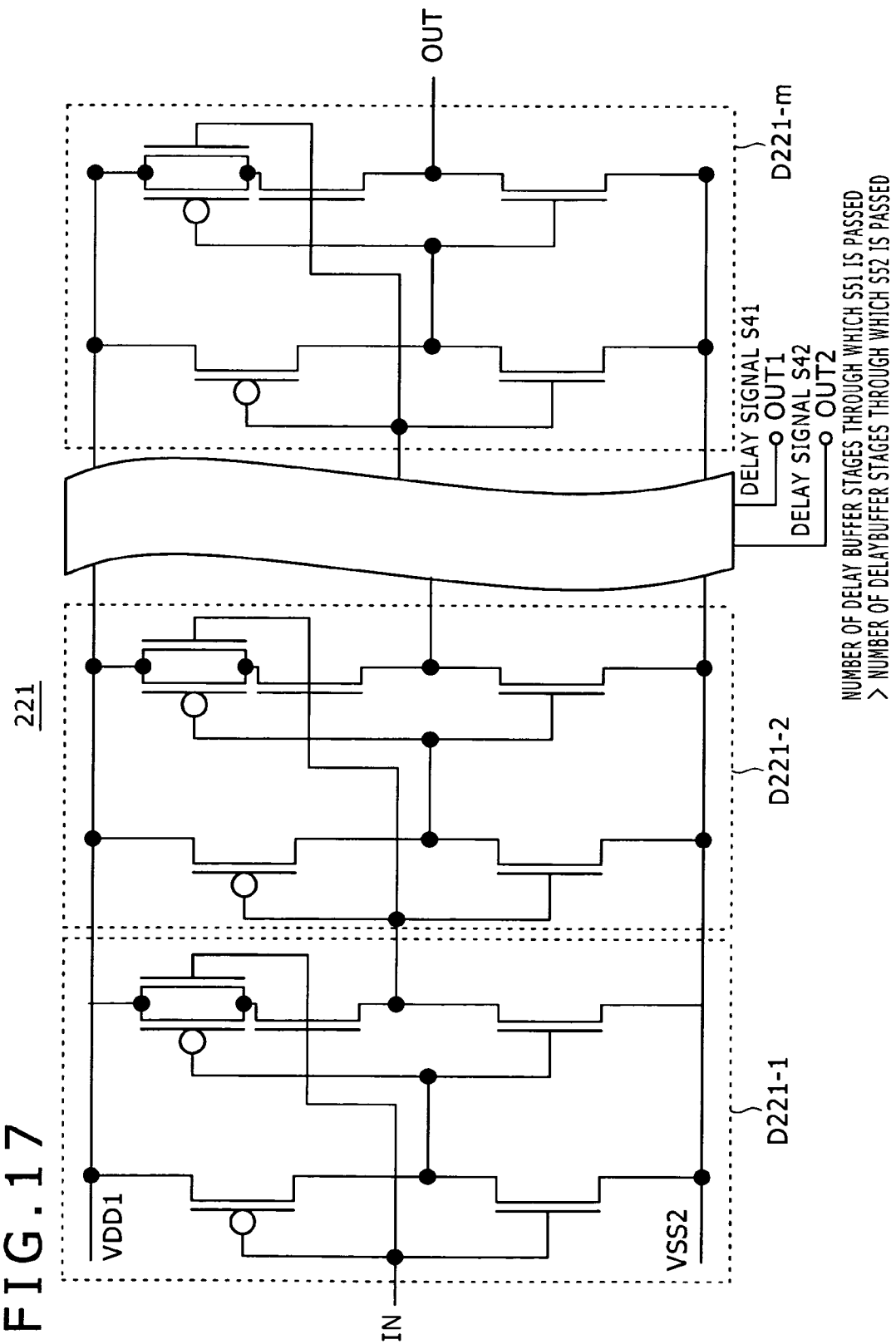
FIG. 17 is a diagram showing a delay buffer train (suppose that the number of delay buffers is m) that generates an amount of delay depending on N-channel transistor characteristics.
Figure 18:
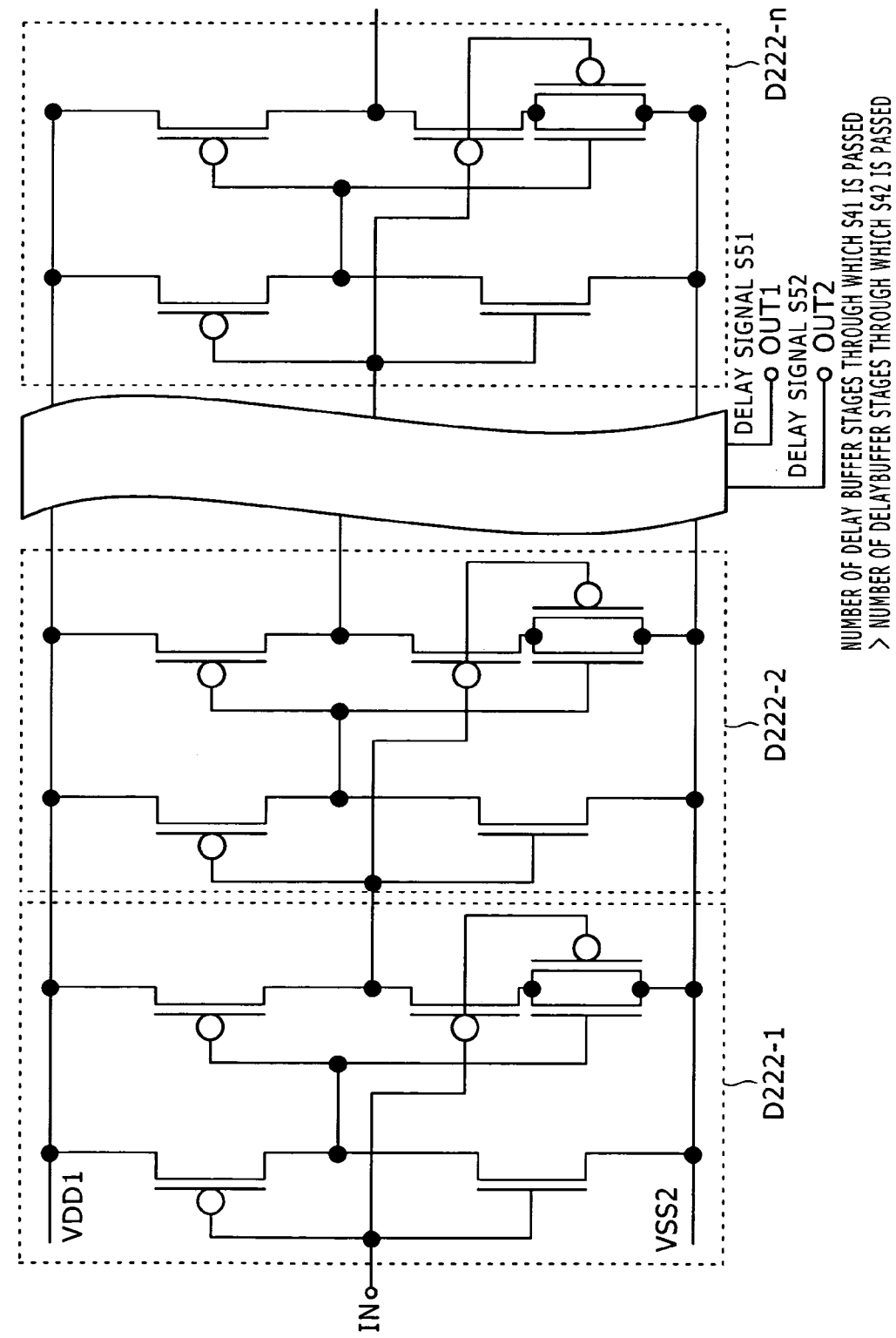
FIG. 18 is a diagram showing a delay buffer train (suppose that the number of delay buffers is n) that generates an amount of delay depending on P-channel transistor characteristics.

FIG. 17 and FIG. 18 are diagrams showing a circuit in which an amount of delay occurs depending on merely a one-channel transistor characteristic.

The circuits described as the foregoing first and second embodiments or the example of modification can be applied as the circuits shown in FIG. 17 and FIG. 18.

FIG. 17 is a diagram showing a delay buffer train (suppose that the number of delay buffers is m) that generates an amount of delay depending on N-channel transistor characteristics.

The delay buffer train 221A has m delay buffer circuits D221-1 to D221-$m$ connected to each other by a cascade connection.

Delayed signals S41 and S42 are output to terminals OUT1 and OUT2, respectively. Suppose that the number of delay buffer stages through which the signal S41 is passed is larger than that of the signal S42.

FIG. 18 is a diagram showing a delay buffer train (suppose that the number of delay buffers is n) that generates an amount of delay depending on P-channel transistor characteristics.

The delay buffer train 222A has n delay buffer circuits D222-1 to D222-$n$ connected to each other by a cascade connection.

Delayed signals S51 and S52 are output to terminals OUT1 and OUT2, respectively. Suppose that the number of delay buffer stages through which the signal S51 is passed is larger than that of the signal S52.

Figures 19, 20:
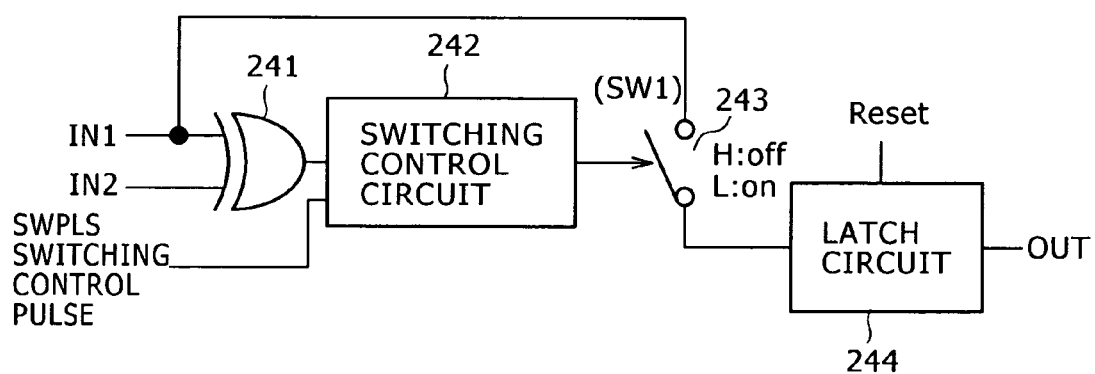
FIG. 19 is a diagram showing an example of configuration of a hysteresis characteristic generating circuit according to the present embodiment.
FIG. 20 is a diagram showing a truth table of the hysteresis characteristic generating circuit of FIG. 19.

FIG. 19 is a diagram showing an example of configuration of the hysteresis characteristic generating circuit according to the present embodiment.

FIG. 20 is a diagram showing a truth table of the hysteresis characteristic generating circuit of FIG. 19.

The hysteresis characteristic generating circuit 240 of FIG. 19 includes an exclusive disjunction (EXOR) gate 241, a switching control circuit 242, a switch 243, and a latch circuit 244.

The hysteresis characteristic generating circuit 240 maintains a previous output state as an output when inputs IN1 and IN2 are at different levels.

When the levels of the inputs IN1 and IN2 are a same delay level (for example a high level), the level of the output OUT is the same as the input level (for example the high level).

A switching control pulse SWPLS is used to prevent a malfunction of the output signal OUT during the switching period of the inputs IN1 and IN2.

In this circuit, the switch 243 is set in an off state during the switching period. After the signal levels of the inputs IN1 and IN2 are completely switched, the switch 243 is set in an on state (enabled) to reflect the input IN1 in the output OUT.

In addition, a reset signal RST is supplied to the latch circuit 244 for the output level of an initial value.

The hysteresis characteristic generating circuit 240 has been described as a circuit receiving both the inputs IN1 and IN2 simply from the delay circuit 220. However, the hysteresis characteristic generating circuit 240 is not limited to this configuration, and is applicable to various configurations.

For example, one input is a delayed signal from the delay circuit, and the other input is obtained by providing a certain delay to the above-described delayed signal by counting of a counter circuit.

Brief description will next be made of an example of output characteristics of a transistor power detecting (sensing) system as opposed to a system as a whole.

Figure 21:
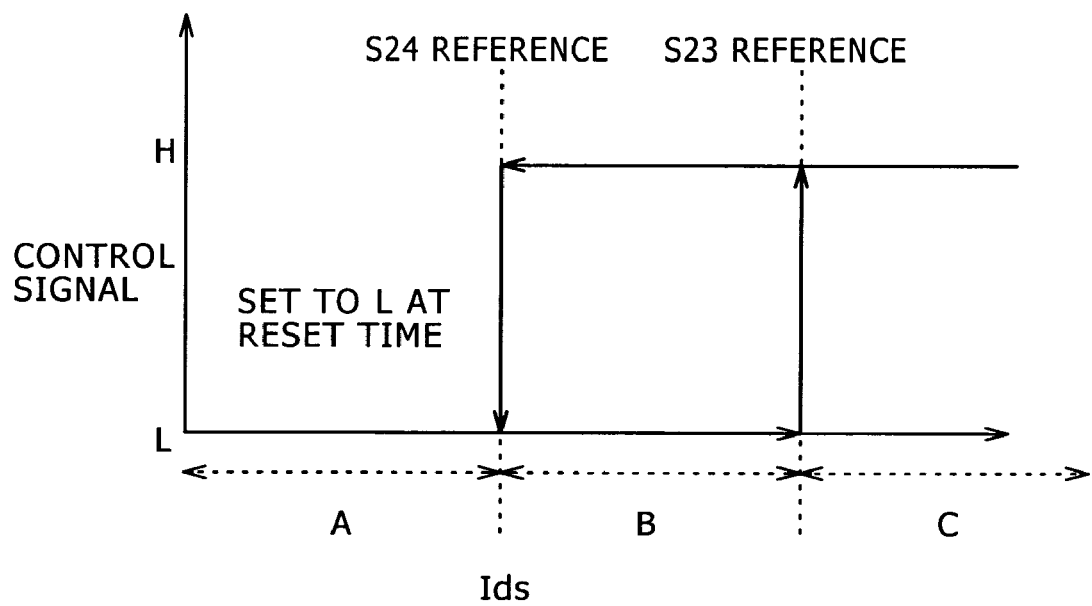
FIG. 21 is a diagram showing an example of output characteristics of a transistor detecting system.

FIG. 21 is a diagram showing an example of output characteristics of a transistor detecting system.

As shown in FIG. 21, first, the level of an output value OUT is set to an initial value by a reset signal. When a detection pulse is supplied, an amount of delay occurs depending on the power characteristic of a transistor. In a case of a current characteristic (drain-to-source current Ids or the like) in a C region as case <1>, the current characteristic is good, and the amount of delay is small. A result of sampling the delayed signals S23 and S24 is an H level. A control signal S240 supplied from the hysteresis characteristic generating circuit 240 is at a high level.

In a case of a current characteristic (drain-to-source current Ids or the like) in a B region as case <2>, the current characteristic is somewhat good, and the amount of delay is somewhat small. A result of sampling the delayed signal S24 is an H level, while a result of sampling the delayed signal S23 is an L level. The control signal S240 supplied from the hysteresis characteristic generating circuit 240 maintains a previous state (in this case, the initial value is RESET), and is thus at a low level.

In a case of a current characteristic (drain-to-source current Ids or the like) in an A region as case <3>, the current characteristic is poor, and the amount of delay is large. A result of sampling the delayed signals S23 and S24 is a low level. The control signal S240 supplied from the hysteresis characteristic generating circuit 240 is at the low level.

In case <1>, when the control signal is at an H level (high level), and a transition is made to the region B (represented by the drain-to-source current Ids) as a panel characteristic is degraded due to some factor (temperature characteristic, frequency, supplied power supply voltage or the like), the control signal is at the H level because the hysteresis characteristic generating circuit 240 maintains a previous output state. When the characteristic is further degraded and a transition is made to the region A, a result of sampling the delayed signals S23 and S24 is the low level, and the control signal S240 supplied from the hysteresis characteristic generating circuit 240 is at the low level. A return is made from the region A to the region B, and the control signal maintains the previous state and is thus at the low level. Further, a return is made from the region B to the region C, and the control signal is set to the high level. By thus providing a hysteresis characteristic, an unstable control signal is not output. (A stable control signal can be output. A stable control system can be realized for the quality of the display device and a driving system.)

Concrete examples of the control object circuit 250 will now be described.

In general, as a method for reducing power consumption, the level of driving voltage is controlled using a voltage comparing circuit. However, when transistor characteristic variations may not be detected (sensed), consideration needs to be given to a wide range of transistor variation. There is thus a problem in that a regulation set value may not be lowered aggressively (for example set to be a positive power supply voltage, and the same is of course true for negative power).

However, by providing the transistor detecting system according to the present embodiment, the power supply voltage is aggressively set low for a transistor having a characteristic better than a standard, and the power supply voltage is aggressively set high for a transistor having a worst characteristic.

A few examples using the transistor detecting system will be shown.

(First Voltage Comparing Circuit)

Figure 22:
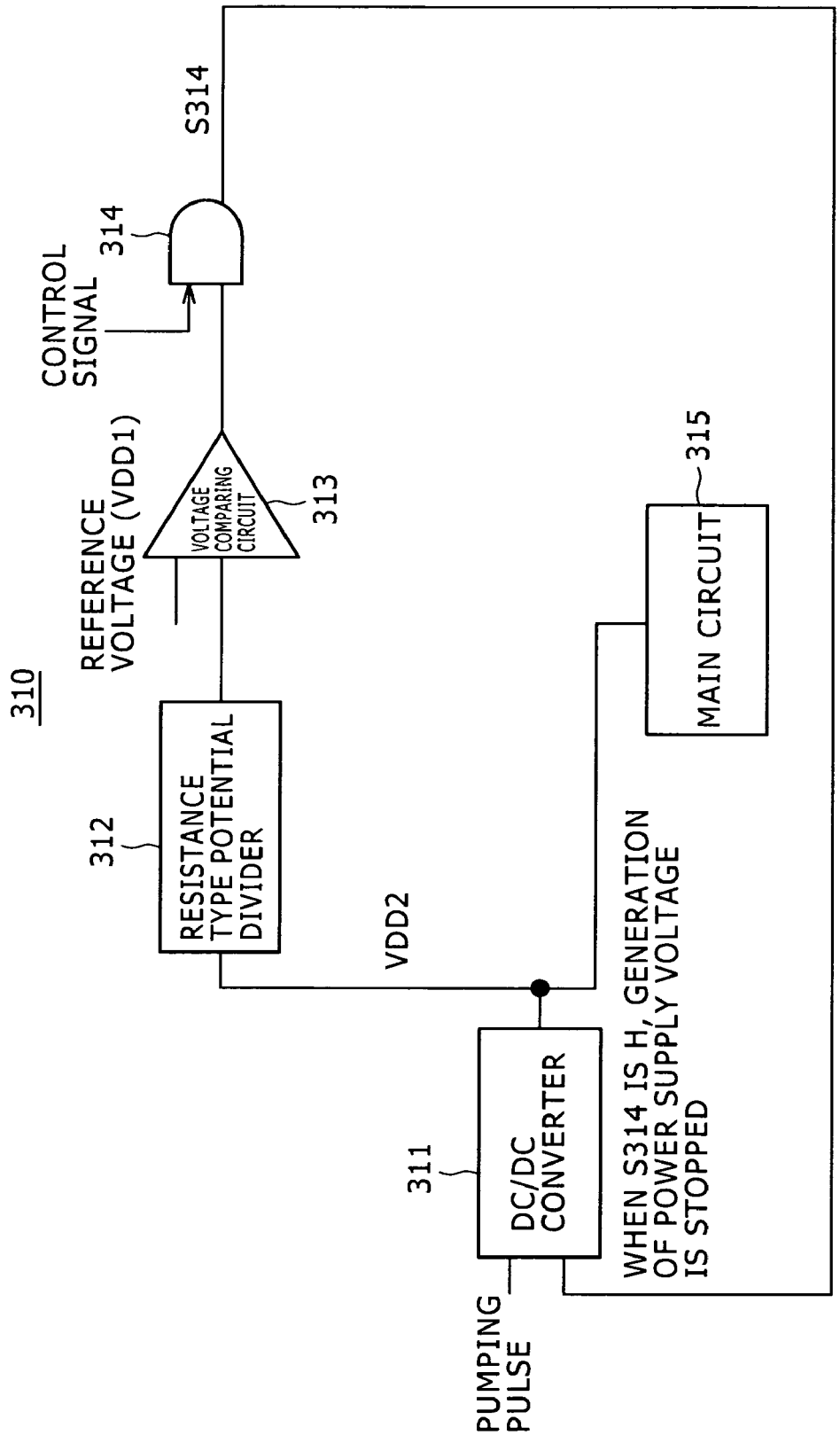
FIG. 22 is a diagram showing a first example of configuration of a system in a case where the transistor detecting system is applied to a voltage comparing circuit for a DC/DC converter.

FIG. 22 is a diagram showing a first example of configuration of a system in a case where the transistor detecting system is applied to a voltage comparing circuit for a DC/DC converter.

The voltage comparing circuit 310 includes a DC/DC converter 311, a resistance type potential divider circuit 312, a voltage comparing circuit 313, an AND gate 314, and a main circuit 315.

When the control signal is at an H level (quoted from FIG. 21 described above and indicating a good transistor characteristic), the voltage comparing circuit 310 is enabled, and the output voltage VDD2 of the DC/DC converter 311 is decreased. When the control signal is at an L level (quoted from FIG. 21 described above and indicating a poor transistor characteristic), the voltage comparing circuit is disabled, and full power is output without the output voltage VDD2 of the DC/DC converter 311 being decreased.

(Second Voltage Comparing Circuit)

Figure 23:
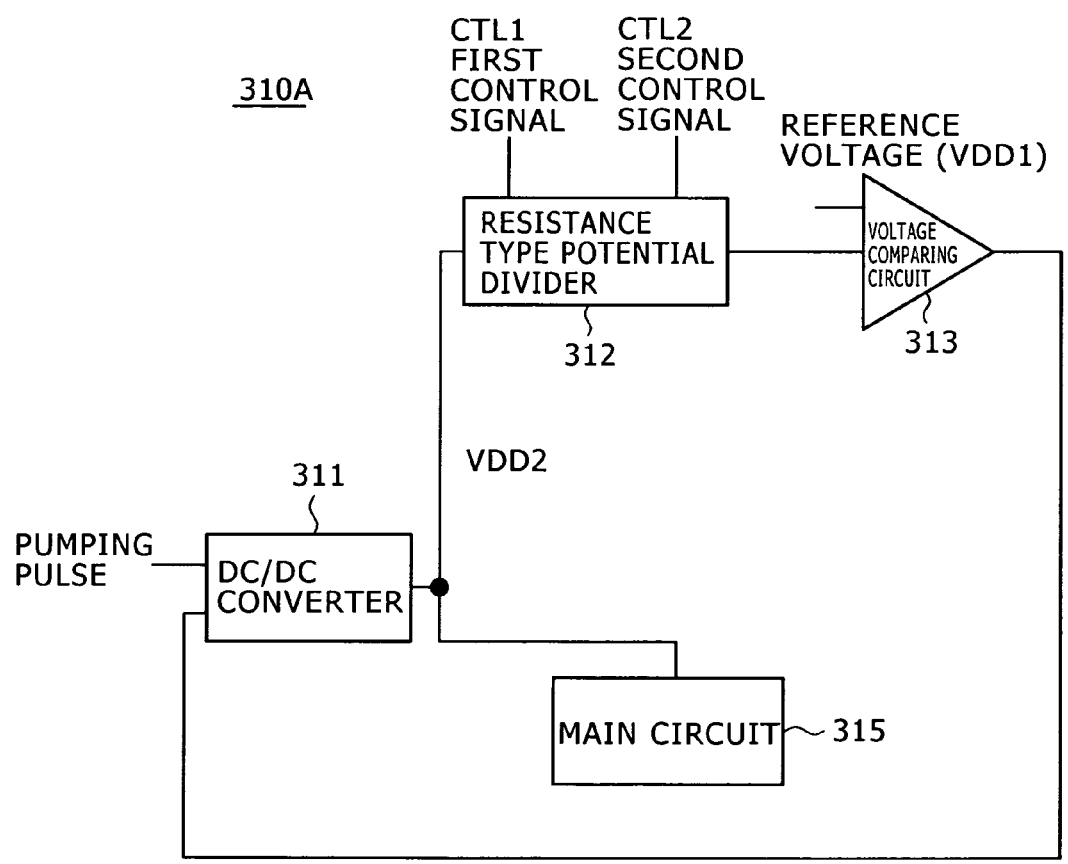
FIG. 23 is a diagram showing a second example of configuration of a system in a case where the transistor detecting system is applied to a voltage comparing circuit for a DC/DC converter.

FIG. 23 is a diagram showing a second example of configuration of a system in a case where the transistor detecting system is applied to a voltage comparing circuit for a DC/DC converter.

A plurality of output signals from a delay circuit train are used, whereby transistor power level can be detected in stages. By outputting a plurality of control signals (two control signals in FIG. 23) CTL1 and CTL2, it is possible not merely to select the enabling or disabling of the voltage comparing circuit as in FIG. 22 but also to set the regulation value (regulation voltage) of the voltage comparing circuit 310A to a plurality of values. For example, when transistor power is at a high level (good), the regulation value is set low. When the transistor power is at a medium level, the regulation value is set at a medium level. When the transistor power is at a low level (poor), the regulation value is set high. In addition, the second configuration example allows various settings to be made using a plurality of control signals.

(Analog Buffer)

Figure 24:
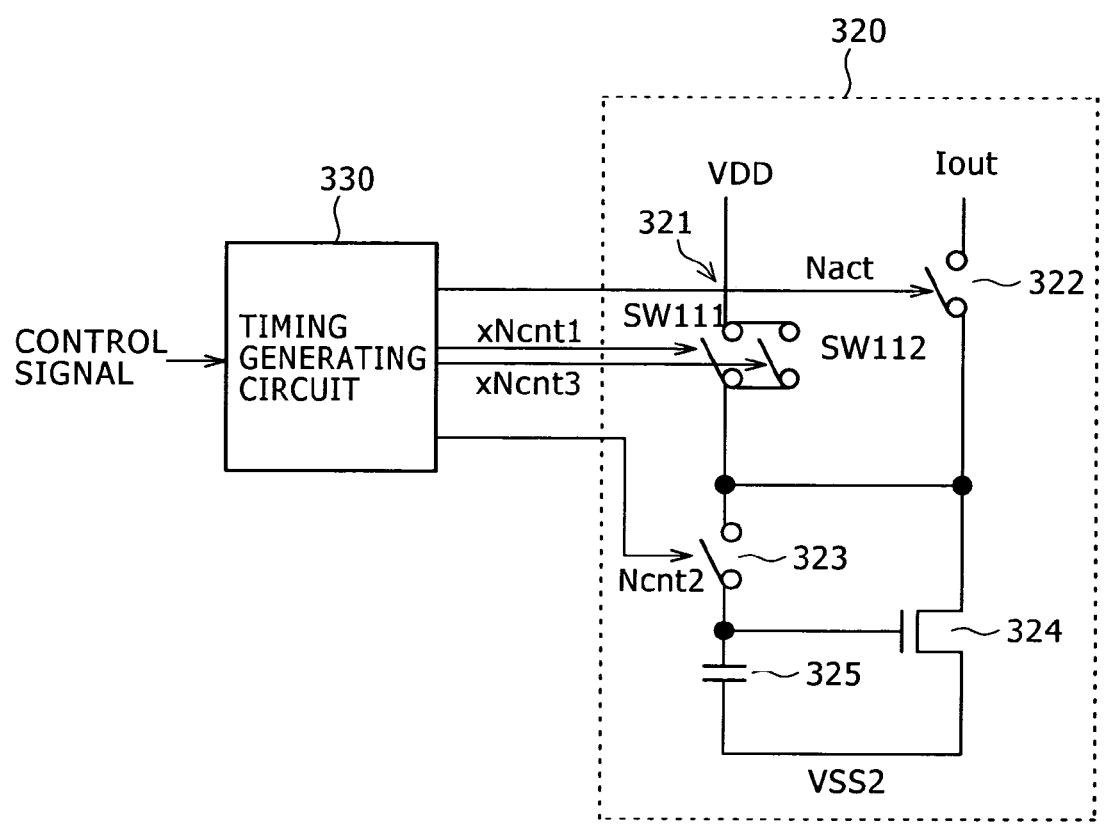
FIG. 24 is a diagram showing an example of configuration of a system in a case where the transistor detecting system is applied to an analog buffer circuit.

FIG. 24 is a diagram showing an example of configuration of a system in a case where the transistor detecting system is applied to an analog buffer circuit.

The analog buffer circuit 320 of FIG. 24 includes switches 321 to 323, an N-channel transistor 324, and a capacitor 325.

A polysilicon process or an amorphous silicon process has a disadvantage of large variations.

In order to reduce effect of such variations, a constant-current source is designed to send a relatively large current.

However, this results in a disadvantage of a correspondingly high power consumption.

Accordingly, the transistor power detecting system according to the present embodiment is used to receive a control signal so that the power of the constant-current source can be adjusted according to transistor power.

For example, in FIG. 24, an output control signal from the transistor power detecting system is input to a timing generating circuit 330, and the timing generating circuit 330 is made to output control pulses xNcnt1 and xNcnt3 for a constant-current source.

When transistor conditions are good, the power of the constant-current source is decreased by enabling the switch SW111 of the switch 321 and disabling the switch SW112 of the switch 321.

When the transistor conditions are poor, the full power of the constant-current source is output by enabling the switch SW111 of the switch 321 and also enabling the switch SW112 of the switch 321.

(Data Processing Circuit)

Figure 25:
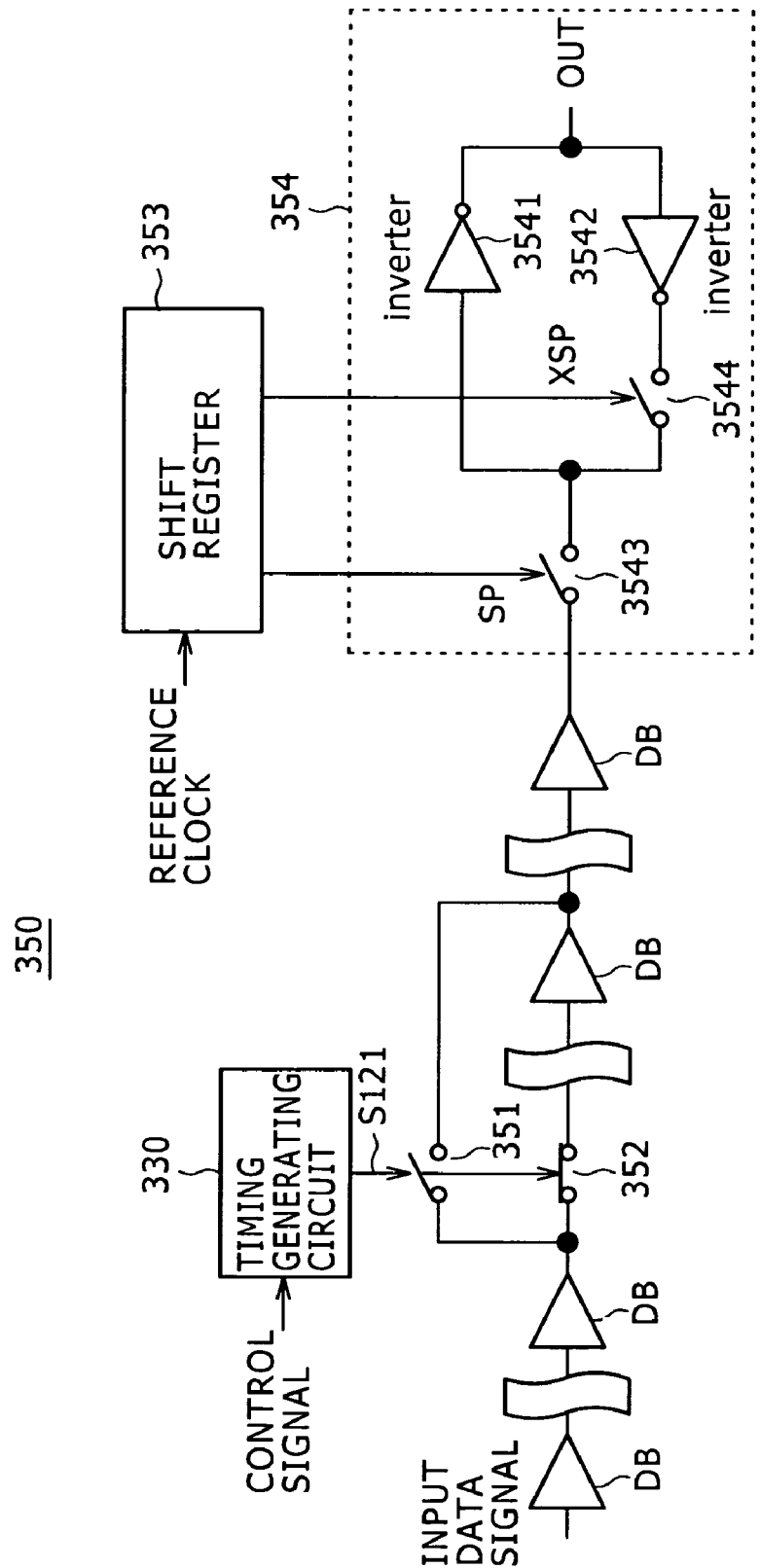
FIG. 25 is a diagram showing an example of configuration of a system in a case where the transistor detecting system is applied to a data processing circuit.

FIG. 25 is a diagram showing an example of configuration of a system in a case where the transistor detecting system is applied to a data processing circuit.

The data processing circuit 350 of FIG. 25 (corresponding to the data processing circuit 106 in FIG. 13 or the like)

includes a plurality of delay buffers DB, switches 351 and 352, a shift register 353, and a latch circuit 354. The latch circuit 354 includes inverters 3541 and 3542 and switches 3543 and 3544.

A polysilicon process or an amorphous silicon process has a disadvantage of large variations.

It is therefore difficult to obtain a correct phase relation between a sampling pulse generated from a reference clock and data desired to be sampled.

If the data desired to be sampled is advanced in phase with respect to the sampling pulse generated from the reference clock, a data series is provided with a delay buffer so that the desired data is delayed.

However, an amount of delay obtained differs depending on transistor variations. It is difficult to adjust the number of delay buffers. The occurrence of an adjustment error means that a mask correction is made, which leads to an unnecessary increase in cost.

In addition, there is a possibility of being unable to accommodate variations with increase in frequency.

This is one of problems that needs to be solved so that the polysilicon process or the amorphous silicon process can be applied to high-frequency driving.

Accordingly, the transistor power detecting system according to the present embodiment is introduced. Thus, when transistor power is good, because of a small amount of delay, the number of delay buffers is increased. When the transistor power is poor, because of a large amount of delay, the number of delay buffers is decreased.

For example, as shown in FIG. 25, an output control signal from the transistor power detecting system is input to a timing generating circuit 330, and a control pulse S121 for controlling the number of delay buffers is output. When transistor power is good, because of a small amount of delay, the number of delay buffers is increased by turning off the switch 351 and turning on the switch 352.

When the transistor power is poor, because of a large amount of delay, the number of delay buffers is decreased by turning on the switch 351 and turning off the switch 352.

While the phase relation between data and the sampling pulse generated by the shift register 353 has been described above, the embodiment of the present invention is not limited to this. Data may be sampled directly with a master clock, or a combination may be made with another logic. The concept is the same.

(Reference Voltage Generating Circuit)

Figure 26:
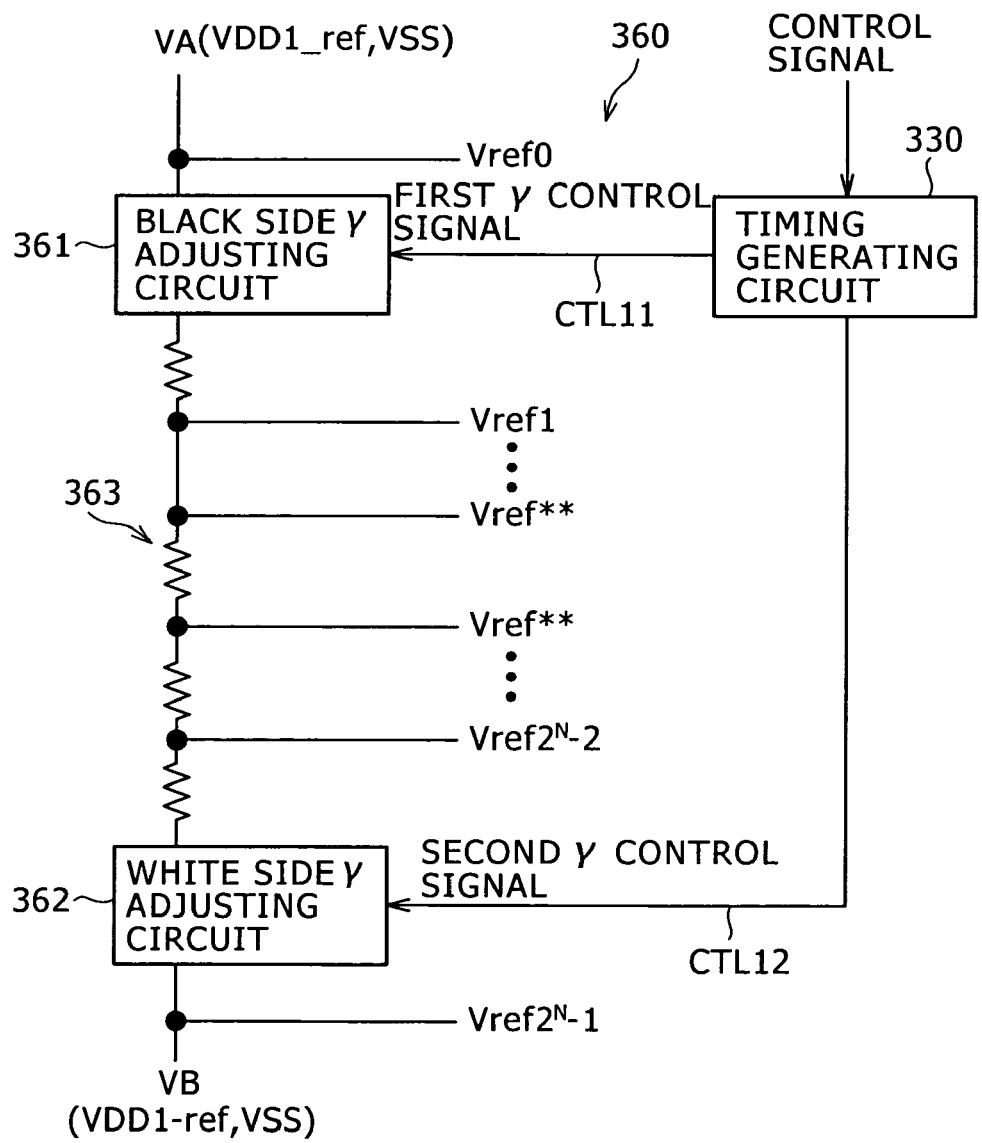
FIG. 26 is a diagram showing an example of configuration of a system in a case where the transistor detecting system is applied to a reference voltage generating circuit.

FIG. 26 is a diagram showing an example of configuration of a system in a case where the transistor detecting system is applied to a reference voltage generating circuit.

The reference voltage generating circuit 360 of FIG. 26 includes a black side γ adjusting circuit 361, a white side γ adjusting circuit 362, and a resistance ladder part 363 generating reference voltages.

For example, a liquid crystal driving power supply voltage is set within a range defined by specifications. A reference voltage generating circuit designed with a power supply voltage at a standard value is common. When supplied power supply voltage becomes different, a gamma (γ) characteristic is also changed. This is one of problems that needs to be solved for improvement in picture quality.

In such a case, a change in power supply voltage can be detected by an optical characteristic sensor to generate a control pulse. A change in power supply voltage can also be detected as variation in transistor power, which will be described in the following.

Two series of a supplied power supply voltage that is the same as power supply voltage (VDD1_ref) for driving a liquid crystal and a supplied power supply voltage that is not the same as the power supply voltage (that is not varied according to specifications, and is the regulation power supply voltage VDD1A of an IC, for example) are provided for delay circuits.

With a same transistor characteristic (Vth), when the power supply voltage (VDD1_ref) for driving the liquid crystal is lowered, there occurs an increase in amount of delay in the delay circuit using the power supply voltage that is the same as the power supply voltage (VDD1_ref) for driving the liquid crystal.

On the other hand, an amount of delay in the delay circuit using the power supply voltage VDD1A that is not the same as the power supply voltage (VDD1_ref) for driving the liquid crystal is unchanged. When a difference between the amounts of delay is a designed period or more, γ control signals CTL11 and CTL12 are output so as to obtain a proper gamma. Thus, a proper gamma can be obtained at all times.

Figure 27:
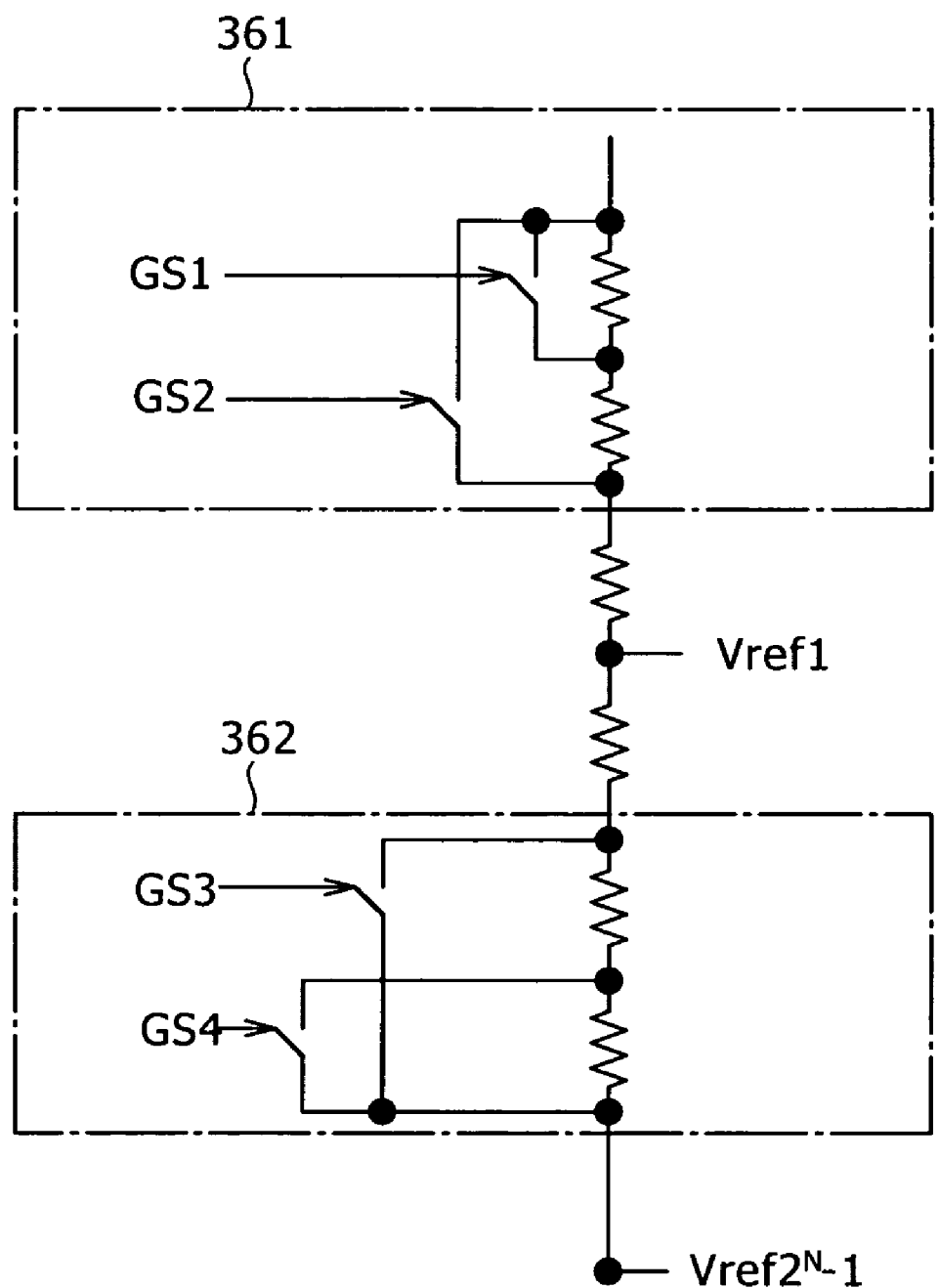
FIG. 27 is a diagram showing a detailed example of a black side γ adjusting circuit and a white side γ adjusting circuit in FIG. 26.

FIG. 27 is a diagram showing a detailed example of the black side γ adjusting circuit and the white side γ adjusting circuit in FIG. 26.

The γ control signal CTL11 in FIG. 26 is signals GS1 and GS2 in FIG. 27. The γ control signal CTL12 in FIG. 26 is signals GS3 and GS4 in FIG. 27.

In the foregoing embodiments, description has been made of a case where a polysilicon process or an amorphous silicon process is used. However, the embodiment of the present invention is not limited to this, and is applicable to circuits in general using defective silicon.

In addition, the embodiment of the present invention is widely applicable to various flat display devices such as various liquid crystal display devices including a TFT liquid crystal display device having a driving circuit formed integrally on an insulating substrate and a CGS (Continuous Grain Silicon) liquid crystal display device, an EL (Electro Luminescence) display device, and the like.

As described above, as effect of the embodiment of the present invention, it is possible to aggressively reduce power consumption by accommodating large variations due to a process, and accommodate the variations. Thus, there is no transistor size that is larger than necessary, and when the embodiment of the present invention is applied to a narrower-frame data processing circuit, an unnecessary cost of a mask for delay buffer correction is saved. A design in a short period of time and a reduction in cost can be achieved.

When the embodiment of the present invention is applied to a data processing circuit, a sampling margin is increased. Thus, the embodiment of the present invention is a technique that is desired more as the frequency of high-speed driving becomes higher. An improvement in yield can be achieved.

When the embodiment of the present invention is applied to a reference voltage generating circuit, it is possible to obtain a proper gamma at all times, and contribute to an improvement in picture quality.

Because of simple circuit configuration, there is little effect on a frame. In addition, when a detection pulse having a long cycle is used, very little power is consumed.

Further, an active matrix type display device typified by the active matrix type liquid crystal display device according to the foregoing embodiment is suitable especially for use as a display unit of an electronic device such as a portable telephone, a PDA or the like which device proper is being reduced in size and made more compact, as well as used as a display of OA equipment such as a personal computer and a word processor, a television receiver, and the like.

Figure 28:
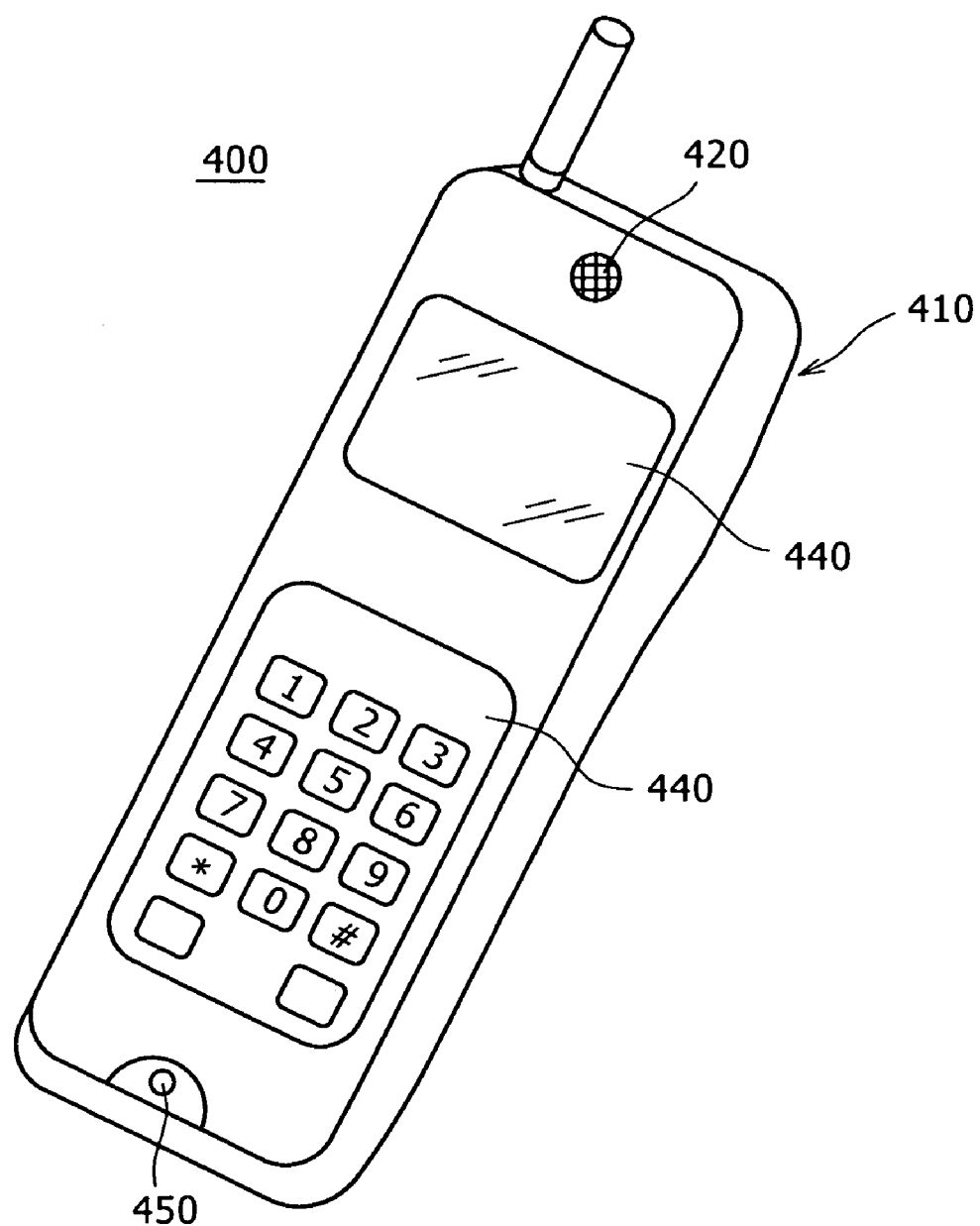
FIG. 28 is an external view of an outline of a configuration of a portable telephone as an electronic device according to an embodiment of the present invention.

FIG. 28 is an external view of an outline of a configuration of an electronic device to which the embodiment of the present invention is applied, for example a portable telephone.

The portable telephone 400 according to this example has a speaker part 420, a display part 430, an operating part 440, and a microphone part 450 arranged in this order from a top side on a front side of a device casing 410.

In the portable telephone of such a configuration, a liquid crystal display device, for example, is used as the display part 430. As this liquid crystal display device, the active matrix type liquid crystal display device according to the foregoing embodiment is used.

Thus, by using the active matrix type liquid crystal display device according to the foregoing embodiment as the display part 430 in an electronic device (portable terminal) such as the portable telephone or the like, it is possible to achieve a narrower pitch, a narrower frame, and lower power consumption of a display device and hence lower power consumption of the terminal proper.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor control circuit for supplying a control signal to a circuit to be controlled, said semiconductor control circuit comprising:
   a delay circuit for receiving a detection pulse, and outputting a plurality of delayed signals having different amounts of delay according to transistor characteristics;
   a sampling circuit for sampling the delayed signals of said delay circuit with said detection pulse as a reference signal; and
   a hysteresis characteristic generating circuit for generating the control signal having a hysteresis characteristic according to a difference between the plurality of delayed signals sampled by said sampling circuit.

2. The semiconductor control circuit according to claim 1, wherein
   said delay circuit includes a plurality of delay series of different channel types.

3. The semiconductor control circuit according to claim 1, wherein
   said delay circuit is a delay circuit for performing one of a charge and a discharge in two stages, and delaying a signal,
   said delay circuit including
      an output section configured to output a delayed signal,
      two power supplies, and
      a delay inverter,
   said delay inverter has a first transistor and a second transistor of an identical channel type for one of a first charge and a first discharge, said first transistor and said second transistor being connected in series with each other between said output section and one power supply, and said delay inverter has a third transistor of a different channel type from said first transistor and said second transistor for one of a second charge and a second discharge, said third transistor being connected in parallel with one of said first transistor and said second transistor.

4. The semiconductor control circuit according to claim 3, wherein
   a pulse of opposite phase in front of an input of said delay inverter is supplied to gates of said first transistor and said second transistor, and one of the first charge and the first discharge is performed with the pulse of opposite phase in front of the input of said delay inverter, and
   an input pulse of said delay inverter is supplied to a gate of said third transistor, and one of the second charge and the second discharge is performed with the input pulse of said delay inverter.

5. A display device comprising:
   an effective display section;
   at least one peripheral circuit for performing processing related to operation of said effective display section; and
   a semiconductor control circuit for outputting a control signal with said peripheral circuit as a circuit to be controlled; wherein
   said effective display section, said peripheral circuit, and said semiconductor control circuit being formed integrally with each other on an insulating substrate,
   said semiconductor control circuit includes
      a delay circuit for receiving a detection pulse, and outputting a plurality of delayed signals having different amounts of delay according to transistor characteristics,
      a sampling circuit for sampling the delayed signals of said delay circuit with said detection pulse as a reference signal, and
      a hysteresis characteristic generating circuit for generating the control signal having a hysteresis characteristic according to a difference between the plurality of delayed signals sampled by said sampling circuit.

6. An electronic device having a display device, wherein said display device includes
   an effective display section;
   at least one peripheral circuit for performing processing related to operation of said effective display section; and
   a semiconductor control circuit for outputting a control signal with said peripheral circuit as a circuit to be controlled;
   said effective display section, said peripheral circuit, and said semiconductor control circuit being formed integrally with each other on an insulating substrate, and
   said semiconductor control circuit includes
      a delay circuit for receiving a detection pulse, and outputting a plurality of delayed signals having different amounts of delay according to transistor characteristics,
      a sampling circuit for sampling the delayed signals of said delay circuit with said detection pulse as a reference signal, and
      a hysteresis characteristic generating circuit for generating the control signal having a hysteresis characteristic according to a difference between the plurality of delayed signals sampled by said sampling circuit.

* * * * *